(12) United States Patent
Zhao et al.

(10) Patent No.: US 10,056,302 B2
(45) Date of Patent: Aug. 21, 2018

(54) SEMICONDUCTOR DEVICE AND RELATED MANUFACTURING METHOD

(71) Applicants: Semiconductor Manufacturing International (Beijing) Corporation, Beijing (CN); Semiconductor Manufacturing International (Shanghai) Corporation, Shanghai (CN)

(72) Inventors: Jie Zhao, Shanghai (CN); Jia Lei Liu, Shanghai (CN); Liang Wang, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/405,150

(22) Filed: Jan. 12, 2017

(65) Prior Publication Data
US 2017/0200655 A1    Jul. 13, 2017

(30) Foreign Application Priority Data
Jan. 12, 2016    (CN) .......................... 2016 1 0017070

(51) Int. Cl.
*H01L 21/8238*    (2006.01)
*H01L 29/49*    (2006.01)
(Continued)

(52) U.S. Cl.
CPC ............. *H01L 21/823842* (2013.01); *H01L 21/28088* (2013.01); *H01L 21/82345* (2013.01);
(Continued)

(58) Field of Classification Search
USPC ......................................... 257/369
See application file for complete search history.

(56) References Cited

U.S. PATENT DOCUMENTS 9,384,984 B2 *    7/2016    Lin .................. H01L 21/28088
2010/0301427 A1 *  12/2010    Lenski ............. H01L 21/28088
                                                              257/392
(Continued)

FOREIGN PATENT DOCUMENTS

EP        2953162 A1    12/2015

OTHER PUBLICATIONS

EP Search Report corresponding to European Patent Application No. 17150134.9, dated May 12, 2017, 17 pages.
(Continued)

*Primary Examiner* — Julio J Maldonado
*Assistant Examiner* — Lawrence Tynes, Jr.
(74) *Attorney, Agent, or Firm* — Innovation Counsel LLP

(57) ABSTRACT

A semiconductor device may include a substrate, a p-channel device, and an n-channel device. The p-channel device may include a first metal member, a first dielectric layer positioned between the substrate and the first metal member, a first barrier layer positioned between the first dielectric layer and the first metal member, a first first-type work function layer directly contacting the first barrier layer and positioned between the first barrier layer and the first metal member, and a first second-type work function layer directly contacting both the first first-type work function layer and the first metal member. The n-channel device may include a
(Continued)

second metal member, a second dielectric layer positioned between the substrate and the second metal member, and a second second-type work function layer directly contacting both the second dielectric layer and the second metal member.

16 Claims, 26 Drawing Sheets

(51) Int. Cl.
    *H01L 27/092*     (2006.01)
    *H01L 21/28*     (2006.01)
    *H01L 21/8234*     (2006.01)
    *H01L 27/088*     (2006.01)

(52) U.S. Cl.
    CPC .......... *H01L 27/088* (2013.01); *H01L 27/092* (2013.01); *H01L 29/4966* (2013.01)

(56) References Cited

U.S. PATENT DOCUMENTS

| | | | | |
|---|---|---|---|---|
| 2012/0132998 A1* | 5/2012 | Kwon | ............... | H01L 21/28088 257/369 |
| 2013/0037889 A1* | 2/2013 | Liao | ................. | H01L 21/28088 257/411 |
| 2013/0126976 A1* | 5/2013 | Yu | ................... | H01L 21/823871 257/369 |
| 2015/0214112 A1* | 7/2015 | Zhao | ................... | H01L 29/4966 257/369 |
| 2016/0020118 A1* | 1/2016 | Park | ................. | H01L 21/28088 438/592 |

OTHER PUBLICATIONS

EP Search Report corresponding to European Patent Application No. 17150134.9, dated Sep. 13, 2017, 18 pages.

* cited by examiner

SEMICONDUCTOR DEVICE AND RELATED MANUFACTURING METHOD

CROSS-REFERENCE TO RELATED APPLICATION

This application claims priority to and benefit of Chinese Patent Application No. 201610017070.7, filed on 12 Jan. 2016; the Chinese Patent Application is incorporated herein by reference in its entirety.

BACKGROUND

The technical field is related to a semiconductor device and a method for manufacturing the semiconductor device.

A semiconductor device may include different transistors. The transistors may include metal gates and may have different work function structures. For implementing the different work function structures, a significant number of lithography processes may be required. The lithography process may incur a significant amount of cost and/or may require a significant amount of time in manufacturing of the semiconductor device.

In the semiconductor device, a significant number of material layers may be required for the work function structures of some of the transistors. As a result, spaces remaining for implementing metal gates in some of the transistors may be very limited, such that filling of metal material in the spaces may be substantially difficult and/or such that some of the implemented metal gates may be defective.

SUMMARY

An embodiment may be related to a semiconductor device. The semiconductor device may include a substrate, a first p-channel device (e.g., a low threshold voltage p-channel device such as a low threshold voltage PMOS transistor), and a first n-channel device (e.g., a low threshold voltage n-channel device such as a low threshold voltage NMOS transistor). The first p-channel device may include a first metal member, a first dielectric layer positioned between the substrate and the first metal member, a first barrier layer positioned between the first dielectric layer and the first metal member, a first first-type work function layer directly contacting the first barrier layer and positioned between the first barrier layer and the first metal member, and a first second-type work function layer directly contacting both the first first-type work function layer and the first metal member and positioned between the first first-type work function layer and the first metal member. The first n-channel device may include a second metal member, a second dielectric layer positioned between the substrate and the second metal member, and a second second-type work function layer directly contacting both the second dielectric layer and the second metal member and positioned between the second dielectric layer and the second metal member.

The semiconductor device may include a second p-channel device (e.g., a standard threshold voltage p-channel device such as a standard threshold voltage PMOS transistor) and a second n-channel device (e.g., a standard threshold voltage n-channel device such as a standard threshold voltage NMOS transistor). The second p-channel device may include the following elements: a third metal member, a third dielectric layer positioned between the substrate and the third metal member, a third barrier layer positioned between the third dielectric layer and the third metal member, and a third second-type work function layer directly contacting both the third barrier layer and the third metal member and positioned between the third barrier layer and the third metal member. The second n-channel device may include the following elements: a fourth metal member, a fourth dielectric layer positioned between the substrate and the fourth metal member, a fourth barrier layer positioned between the fourth dielectric layer and the fourth metal member, and a fourth second-type work function layer directly contacting both the fourth barrier layer and the fourth metal member and positioned between the fourth barrier layer and the fourth metal member.

A threshold voltage of the first p-channel device may be lower than a threshold voltage of the second p-channel device. A threshold voltage of the first n-channel device may be lower than a threshold voltage of the second n-channel device.

The semiconductor device may include a third p-channel device (e.g., a high threshold voltage p-channel device such as a high threshold voltage PMOS transistor) and a third n-channel device (e.g., a high threshold voltage n-channel device such as a high threshold voltage NMOS transistor). The third p-channel device may include the following elements: a fifth metal member, a fifth dielectric layer positioned between the substrate and the fifth metal member, a fifth first-type work function layer directly contacting the fifth dielectric layer and positioned between the fifth dielectric layer and the fifth metal member, and a fifth second-type work function layer directly contacting both the fifth first-type work function layer and the fifth metal member and positioned between the fifth first-type work function layer and the fifth metal member. The third n-channel device may include the following elements: a sixth metal member, a sixth dielectric layer positioned between the substrate and the sixth metal member, a sixth barrier layer positioned between the sixth dielectric layer and the sixth metal member, a sixth first-type work function layer directly contacting the sixth barrier layer and positioned between the sixth barrier layer and the sixth metal member, and a sixth second-type work function layer directly contacting both the sixth first-type work function layer and the sixth metal member and positioned between the sixth first-type work function layer and the sixth metal member.

A threshold voltage of the third p-channel device may be higher than a threshold voltage of the second p-channel device. A threshold voltage of the third n-channel device may be higher than a threshold voltage of the second n-channel device. A threshold voltage of the first p-channel device may be lower than the threshold voltage of the second p-channel device. A threshold voltage of the first n-channel device may be lower than the threshold voltage of the second n-channel device.

The substrate may include a first region, a second region, a third region, a fourth region, a fifth region, and a sixth region respectively designated for the first p-channel device, the first n-channel device, the second p-channel device, the second n-channel device, the third p-channel device, and the third n-channel device.

An embodiment may be related to a semiconductor device. The semiconductor device may include a substrate, a first x-channel device, and a second x-channel device, wherein the x represents p or n. The first x-channel device may include the following elements: a first metal member, a first dielectric layer positioned between the substrate and the first metal member, and a first first-type work function layer directly contacting the first dielectric layer and positioned between the first dielectric layer and the first metal member.

The second x-channel device may include the following elements: a second metal member, a second dielectric layer positioned between the substrate and the second metal member, a second first-type work function layer positioned between the second dielectric layer and the second metal member, and a barrier layer directly contacting the second first-type work function layer and positioned between the second dielectric layer and the second first-type work function layer.

The first first-type work function layer may directly contact the first metal member or may directly contact a first second-type work function layer. If the first first-type work function layer directly contacts the first second-type work function layer, the first second-type work function layer may directly contact the first metal member and may be positioned between the first first-type work function layer and the first metal member.

An embodiment may be related to a method for manufacturing a semiconductor device. The method may include the following steps: providing a substrate; providing a first p-channel device, which may include the following elements: a first metal member, a first dielectric layer positioned between the substrate and the first metal member, a first barrier layer positioned between the first dielectric layer and the first metal member, a first first-type work function layer directly contacting the first barrier layer and positioned between the first barrier layer and the first metal member, and a first second-type work function layer directly contacting both the first first-type work function layer and the first metal member and positioned between the first first-type work function layer and the first metal member; and providing a first n-channel device, which may include the following elements: a second metal member, a second dielectric layer positioned between the substrate and the second metal member, and a second second-type work function layer directly contacting both the second dielectric layer and the second metal member and positioned between the second dielectric layer and the second metal member.

The method may include the following steps: preparing a dielectric member, which overlaps the substrate, wherein the dielectric member may have a first trench and a second trench, which may be respectively designated for the first p-channel device and the first n-channel device; sequentially providing a first insulating layer, the first dielectric layer, a first cap layer, the first barrier layer, and the first first-type work function layer inside the first trench; sequentially providing a second insulating layer, a second dielectric layer, a second cap layer, and a second barrier layer inside the second trench; removing the second barrier layer and the second cap layer; providing a second first-type work function layer, which may directly contact the second dielectric layer; and removing the second first-type work function layer.

The method may include the following steps: providing the first second-type work function layer, which may directly contact the first first-type work function layer; providing the second second-type work function layer, which may directly contact the second dielectric layer; providing the first metal member, which may directly contact the first second-type work function layer; and providing the second metal member, which may directly contact the second second-type work function layer.

The dielectric member may have a third trench and a fourth trench, which may be respectively designated for a second p-channel device and a second n-channel device. The method may include the following steps: sequentially providing a third insulating layer, a third dielectric layer, a third cap layer, a third barrier layer, and a third first-type work function layer inside the third trench; sequentially providing a fourth insulating layer, a fourth dielectric layer, a fourth cap layer, a fourth barrier layer, and a fourth first-type work function layer inside the fourth trench; and removing the third first-type work function layer and the fourth first-type work function layer.

The method may include the following steps: providing a third second-type work function layer, which may directly contact the third barrier layer; providing a fourth second-type work function layer, which may directly contact the fourth barrier layer; providing a third metal member, which may directly contact the third second-type work function layer; and providing a fourth metal member, which may directly contact the fourth second-type work function layer.

The method may include the following steps: providing the second p-channel device, which may include the following elements: the third metal member, the third dielectric layer positioned between the substrate and the third metal member, the third barrier layer positioned between the third dielectric layer and the third metal member, and the third second-type work function layer directly contacting both the third barrier layer and the third metal member and positioned between the third barrier layer and the third metal member; and providing the second n-channel device, which may include the following elements: the fourth metal member, the fourth dielectric layer positioned between the substrate and the fourth metal member, the fourth barrier layer positioned between the fourth dielectric layer and the fourth metal member, and the fourth second-type work function layer directly contacting both the fourth barrier layer and the fourth metal member and positioned between the fourth barrier layer and the fourth metal member.

A threshold voltage of the first p-channel device may be lower than a threshold voltage of the second p-channel device. A threshold voltage of the first n-channel device may be lower than a threshold voltage of the second n-channel device.

The dielectric member may have a fifth trench and a sixth trench, which may be respectively designated for a third p-channel device and a third n-channel device. The method may include the following steps: sequentially providing a fifth insulating layer, a fifth dielectric layer, a fifth cap layer, and a fifth barrier layer inside the fifth trench; sequentially providing a sixth insulating layer, a sixth dielectric layer, a sixth cap layer, and a sixth barrier layer inside the sixth trench; removing the fifth barrier layer and the fifth cap layer; after the fifth barrier layer and the fifth cap layer have been removed, providing a fifth first-type work function layer, which may directly contact the fifth dielectric layer; and providing a sixth first-type work function layer, which may directly contact the sixth barrier layer.

The method may include the following steps: providing a fifth second-type work function layer, which may directly contact the fifth first-type work function layer; providing a sixth second-type work function layer, which may directly contact the sixth first-type work function layer; providing a fifth metal member, which may directly contact the fifth second-type work function layer; and providing a sixth metal member, which may directly contact the sixth second-type work function layer.

The method may include the following steps: providing the third p-channel device, which may include the following elements: the fifth metal member, the fifth dielectric layer positioned between the substrate and the fifth metal member, the fifth first-type work function layer directly contacting the fifth dielectric layer and positioned between the fifth dielectric layer and the fifth metal member, and the fifth second-type work function layer directly contacting both the fifth first-type work function layer and the fifth metal member and positioned between the fifth first-type work function layer and the fifth metal member; and providing the third n-channel device, which may include the following elements: the sixth metal member, the sixth dielectric layer positioned between the substrate and the sixth metal member, the sixth barrier layer positioned between the sixth dielectric layer and the sixth metal member, the sixth first-type work function layer directly contacting the sixth barrier layer and positioned between the sixth barrier layer and the sixth metal member, and the sixth second-type work function layer directly contacting both the sixth first-type work function layer and the sixth metal member and positioned between the sixth first-type work function layer and the sixth metal member.

A threshold voltage of the third p-channel device may be higher than a threshold voltage of the second p-channel device. A threshold voltage of the third n-channel device may be higher than a threshold voltage of the second n-channel device. A threshold voltage of the first p-channel device may be lower than the threshold voltage of the second p-channel device. A threshold voltage of the first n-channel device may be lower than the threshold voltage of the second n-channel device.

The method may include using a first mask for removing all of the second barrier layer, the second cap layer, the fifth barrier layer, and the fifth cap layer.

The method may include using a second mask for removing all of the second first-type work function layer, the third first-type work function layer, and the fourth first-type work function layer.

According to embodiments, in manufacturing of a semiconductor device, the number of lithography processes and/or masks required for implementing different work function structures may be minimized. Advantageously, manufacturing cost and/or manufacturing time for the semiconductor may be minimized.

According to embodiments, in implementation of different work function structures of a semiconductor device, numbers of material layers may be minimized, such that sufficient spaces for filling metal material may be provided. Advantageously, implementation of metal gates in the semiconductor device may be facilitated, satisfactory quality of the metal gates may be attained, and/or satisfactory quality of the semiconductor device may be attained.

The above summary is related to some of many embodiments disclosed herein and is not intended to limit the scope of embodiments.

DETAILED DESCRIPTION

Figure 1A:
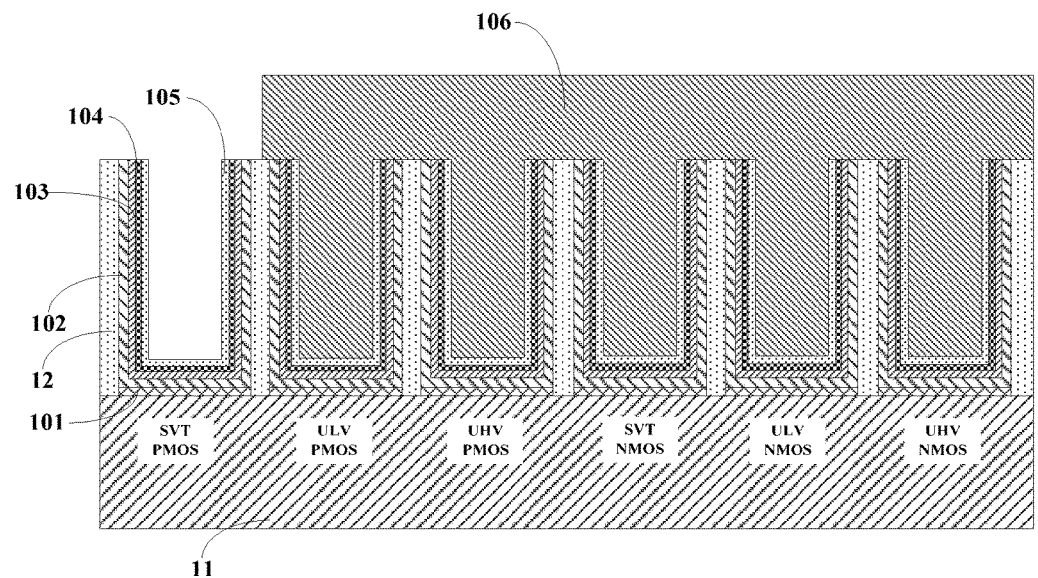
FIG. 1A, FIG. 1B, FIG. 1C, FIG. 1D, FIG. 1E, FIG. 1F, FIG. 1G, and FIG. 1H show schematic diagrams (e.g., schematic cross-sectional views) that illustrate elements and/or structures formed in a step in a method for manufacturing a semiconductor device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect", "directly connect", or "indirectly connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1A, FIG. 1B, FIG. 1C, FIG. 1D, FIG. 1E, FIG. 1F, FIG. 1G, and FIG. 1H show schematic diagrams (e.g., schematic cross-sectional views) that illustrate elements and/or structures formed in a step in a method for manufacturing a semiconductor device in accordance with one or more embodiments. The semiconductor device may include p-channel devices (e.g., p-channel devices) and n-channel devices (e.g., n-channel devices). The p-channel devices may be, for example, p-channel metal-oxide-semiconductor field-effect (PMOS) devices. The n-channel devices may be, for example, n-channel metal-oxide-semiconductor field-effect (NMOS) devices.

Referring to FIG. 1, the method may include preparing a substrate 11, which may include six regions respectively designated for a low threshold voltage p-channel device (represented by ULV PMOS), a low threshold voltage n-channel device (represented by ULV NMOS), a standard threshold voltage p-channel device (represented by SVT PMOS), a standard threshold voltage n-channel device (represented by SVT NMOS), a high threshold voltage p-channel device (represented by UHV PMOS), a high threshold voltage n-channel device (represented by UHV NMOS). A threshold voltage of the ULV PMOS is lower than a threshold voltage of the SVT PMOS. A threshold voltage of the ULV NMOS is lower than a threshold voltage of the SVT NMOS. A threshold voltage of the UHV PMOS is higher than a threshold voltage of the SVT PMOS. A threshold voltage of the UHV NMOS is higher than a threshold voltage of the SVT NMOS.

The method may include preparing a first-type dielectric layer 12 on the substrate 11. The first-type dielectric layer 12 may have six trenches respectively positioned at the six regions and respectively designated for the ULV PMOS, the ULV NMOS, the SVT PMOS, the SVT NMOS, the UHV PMOS, and the UHV NMOS. For facilitate description, the six trenches are respectively called the ULV PMOS trench, the ULV NMOS trench, the SVT PMOS trench, the SVT NMOS trench, the UHV PMOS trench, and the UHV NMOS trench.

The method may include the following steps: forming dummy gate members (and dummy oxide members) on the substrate 11; providing a first-type dielectric material layer on the substrate 11, wherein portions of the first-type dielectric material layer are positioned between the dummy gate members; and planarizing the first-type dielectric material layer; removing the dummy gate members (and the dummy oxide members) to form the first-type dielectric layer 12 with the six trenches.

The method may include the following steps: sequentially providing an insulating layer 101 (or interface layer 101), a second-type dielectric layer 102 (e.g., a high-k dielectric layer with a dielectric constant greater than 3.9 and/or greater than a dielectric constant of silicon dioxide), a cap layer 103, a barrier layer 104, and a PMOS work function layer 105 in each of the six trenches; subsequently, providing a patterned photoresist 106, which exposes the SVT PMOS trench and covers the other five trenches; subsequently, removing the PMOS work function layer 105 that has been provided inside the SVT PMOS trench; and subsequently removing the patterned photoresist 106.

Figure 1B:
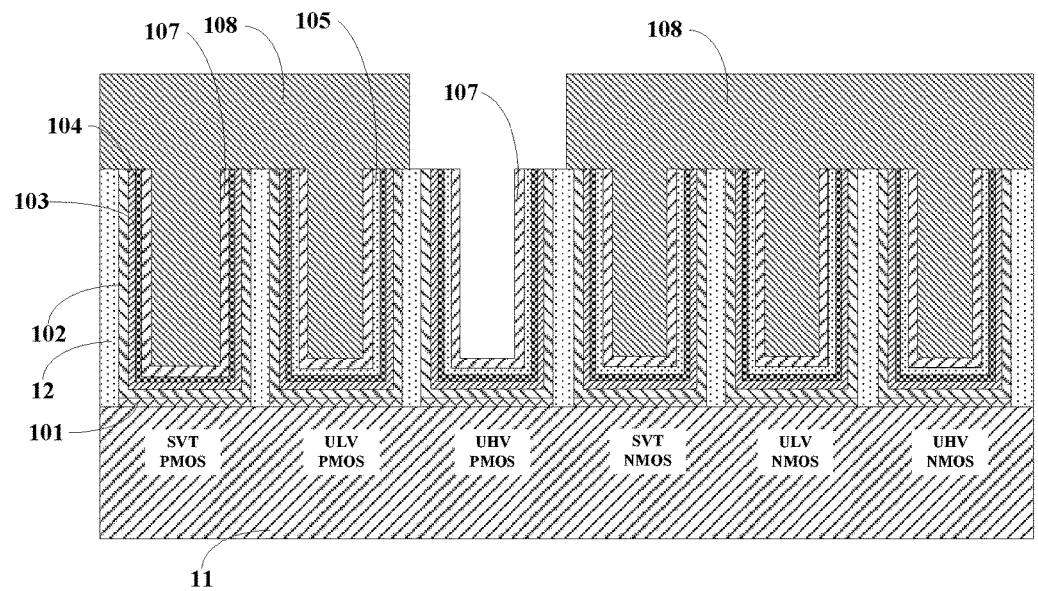

Referring to FIG. 1A and FIG. 1B, the method may include the following steps: providing a PMOS work function layer 107 in each of the six trenches; and subsequently providing a patterned photoresist 108, which exposes the UHV PMOS trench and covers the other five trenches.

Figure 1C:
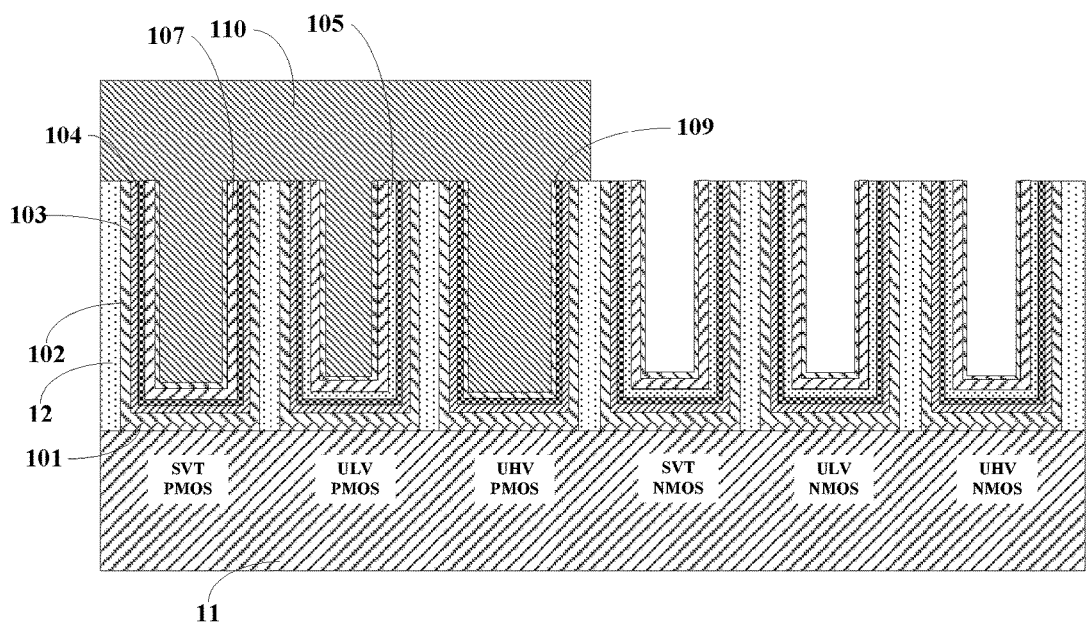
Figure 1D:
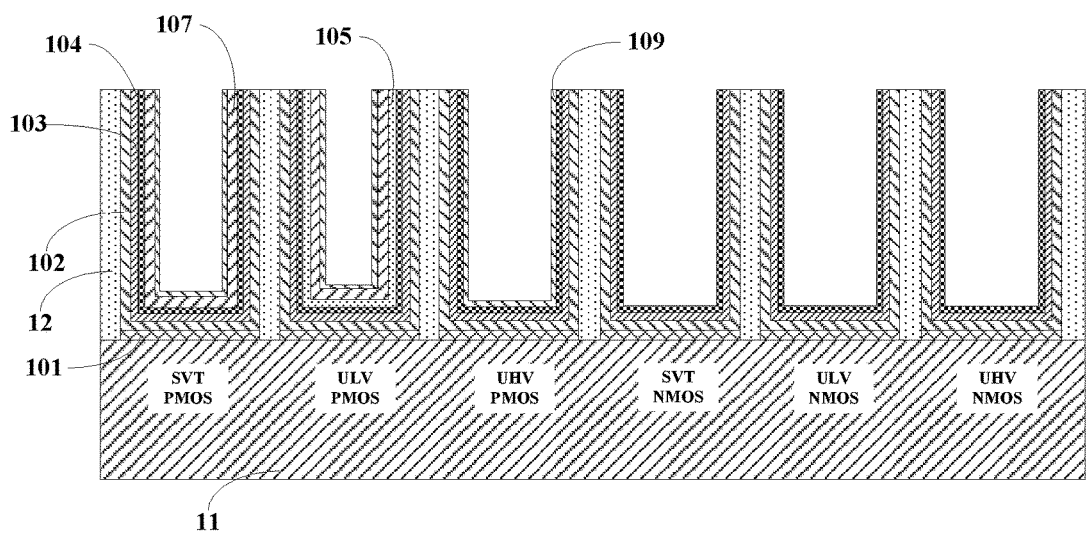

Referring to FIG. 1B, FIG. 1C, and FIG. 1D, the method may include the following steps: removing the PMOS work function layer 107 and the PMOS work function layer 105 that have been provided inside the UHV PMOS trench; subsequently removing the patterned photoresist 108; subsequently providing a PMOS work function layer 109 in each of the six trenches; subsequently providing a patterned photoresist 110, which exposes the SVT NMOS trench, the ULV NMOS trench, and the UHV NMOS trench and covers the other three trenches; subsequently removing the PMOS work function layers 109, the PMOS work function layers 107, and the PMOS work function layers 105 that have been provided inside the SVT NMOS trench, the ULV NMOS trench, and the UHV NMOS trench; and subsequently removing the patterned photoresist 110.

Figure 1E:
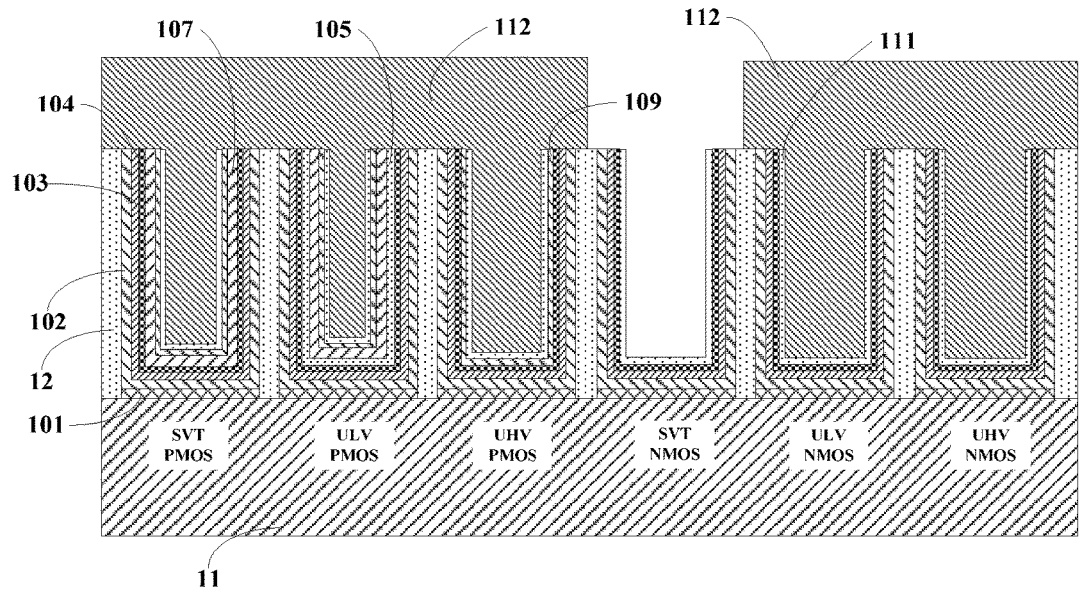

Referring to FIG. 1D and FIG. 1E, the method may include the following steps: providing an NMOS work function layer 111 in each of the six trenches; subsequently providing a patterned photoresist 112, which exposes the SVT NMOS trench and covers the other five trenches.

Figure 1F:
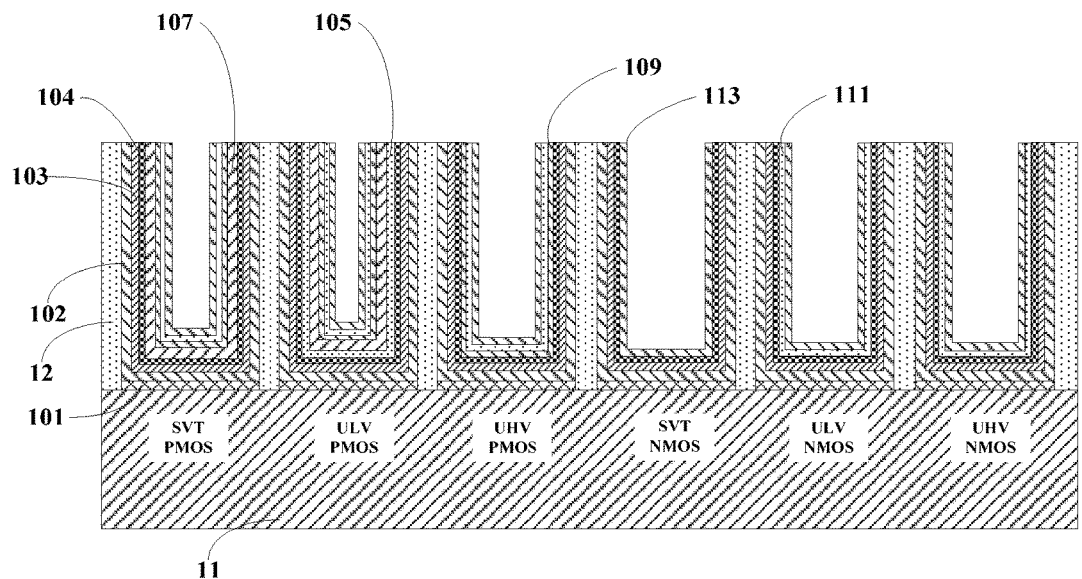

Referring to FIG. 1E and FIG. 1F, the method may include the following steps: removing the NMOS work function layer 111 that has been provided inside the SVT NMOS trench; subsequently removing the patterned photoresist 112; and subsequently providing an NMOS work function layer 113 in each of the six trenches.

Figure 1G:
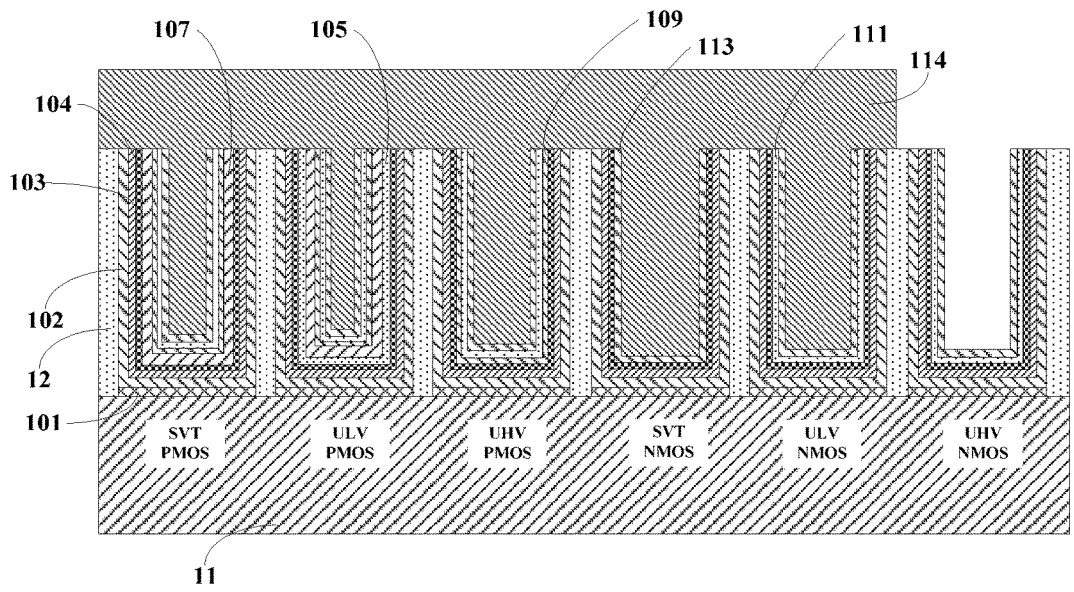

Referring to FIG. 1F and FIG. 1G, the method may include the following steps: providing a patterned photoresist 114, which exposes the UHV NMOS trench and covers the other five trenches.

Figure 1H:
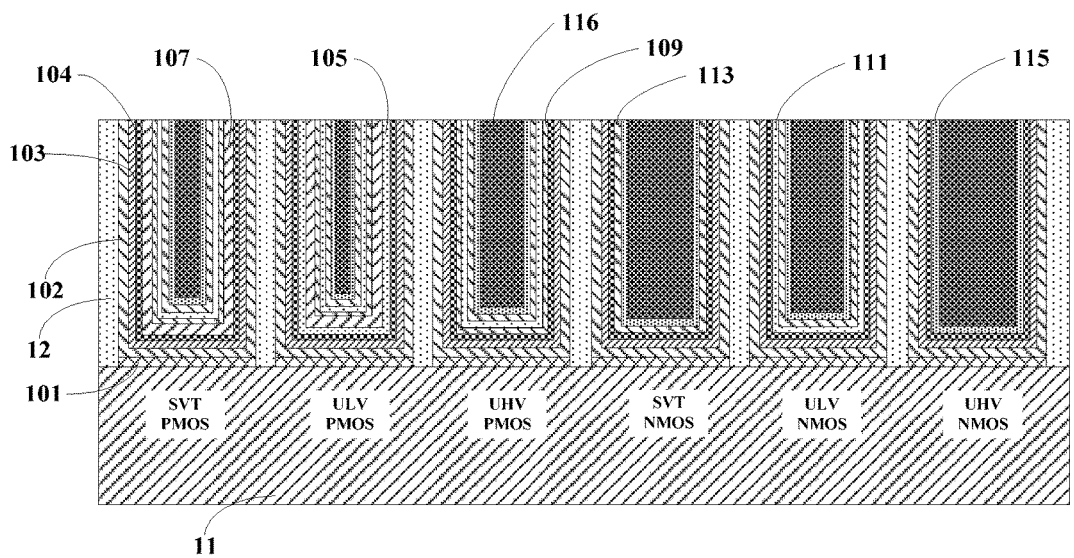

Referring to FIG. 1G and FIG. 1H, the method may include removing the work function layer 113 and the work function layer 111 that have been provided inside the UHV NMOS trench; subsequently removing the patterned photoresist 114; subsequently providing an NMOS work function layer 115 in each of the six trenches; and subsequently providing a metal member 116 in each of the six trenches.

Referring to FIG. 1H, in the semiconductor device, the ULV PMOS device may include a work function structure (i.e., work function tuning/adjusting structure) that includes the following work function layers (i.e., work function tuning/adjusting layers): a PMOS work function layer 105, a PMOS function layer 107, and a PMOS work function layer 109.

The SVT PMOS device may include a work function structure that includes the following work function layers: a PMOS function layer 107 and a PMOS work function layer 109.

The UHV PMOS device may include a work function structure that includes the following work function layer: a work function layer 109.

The ULV NMOS device may include a work function structure (i.e., work function tuning/adjusting structure) that includes the following work function layers (i.e., work function tuning/adjusting layers): an NMOS work function layer 111, an NMOS function layer 113, and an NMOS work function layer 115.

The SVT NMOS device may include a work function structure that includes the following work function layers: an NMOS function layer 113 and an NMOS work function layer 115.

The UHV NMOS device may include a work function structure that includes the following work function layer: a work function layer 115.

Figure 2:
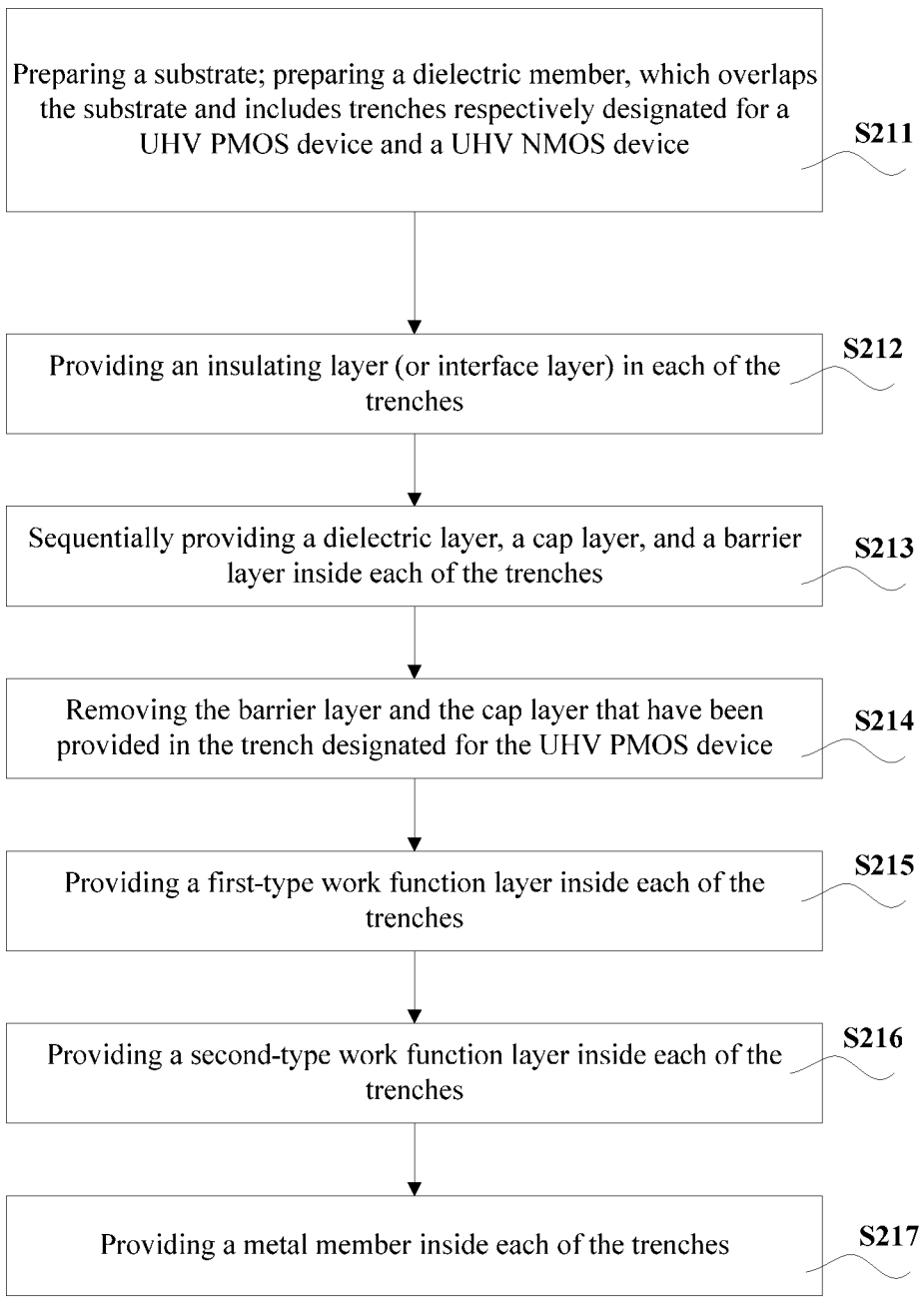
FIG. 2 shows a flowchart that illustrates steps in a method for manufacturing a semiconductor device in accordance with one or more embodiments.

FIG. 2 shows a flowchart that illustrates steps in a method for manufacturing a semiconductor device in accordance with one or more embodiments. FIG. 3A, FIG. 3B, FIG. 3C, FIG. 3D, FIG. 3E, FIG. 3F, and FIG. 3G show schematic diagrams (e.g., schematic cross-sectional views) that illustrate elements and/or structures formed in a step in a method for manufacturing the semiconductor device in accordance with one or more embodiments. Referring to FIG. 2, the method may include steps S211, S212, S213, S214, S215, S216, and S217.

Figure 3A:
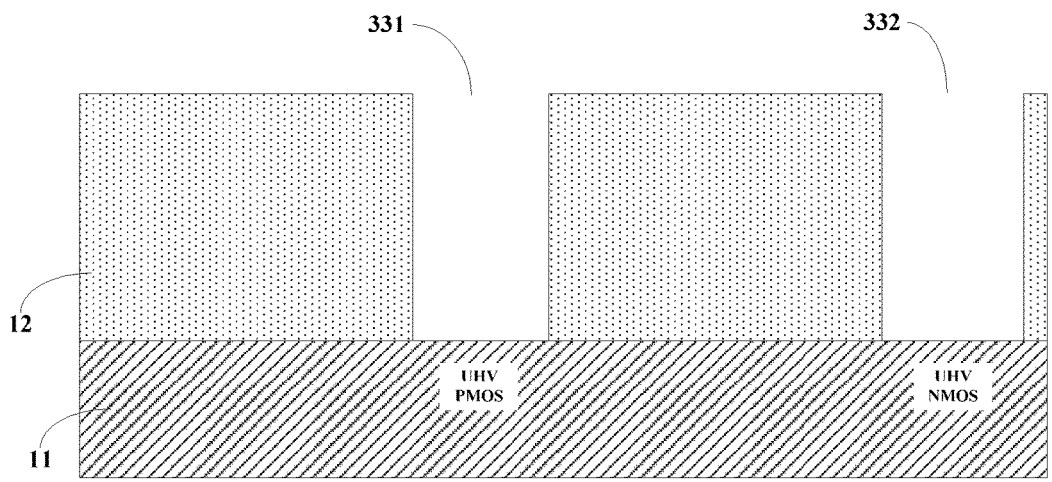
FIG. 3A, FIG. 3B, FIG. 3C, FIG. 3D, FIG. 3E, FIG. 3F, and FIG. 3G show schematic diagrams (e.g., schematic cross-sectional views) that illustrate elements and/or structures formed in a step in a method for manufacturing a semiconductor device in accordance with one or more embodiments.

Referring to FIG. 2 and FIG. 3A, the step S211 may include the following steps: preparing a substrate 11; and preparing a dielectric member 12, which may overlap the substrate 11. The substrate 11 may include two regions respectively designated for a p-channel device, e.g., a UHV PMOS device, and an n-channel device, e.g., a UHV NMOS device. The dielectric member 12 may have a trench 331 and a trench 332, which may be respectively designated for (a gate structure of) the p-channel device, e.g., the UHV PMOS device, and (a gate structure of) the n-channel device, e.g., the UHV NMOS device. The trenches 331 and 332 may respectively (partially) expose the two regions of the substrate 11.

Figure 3B:
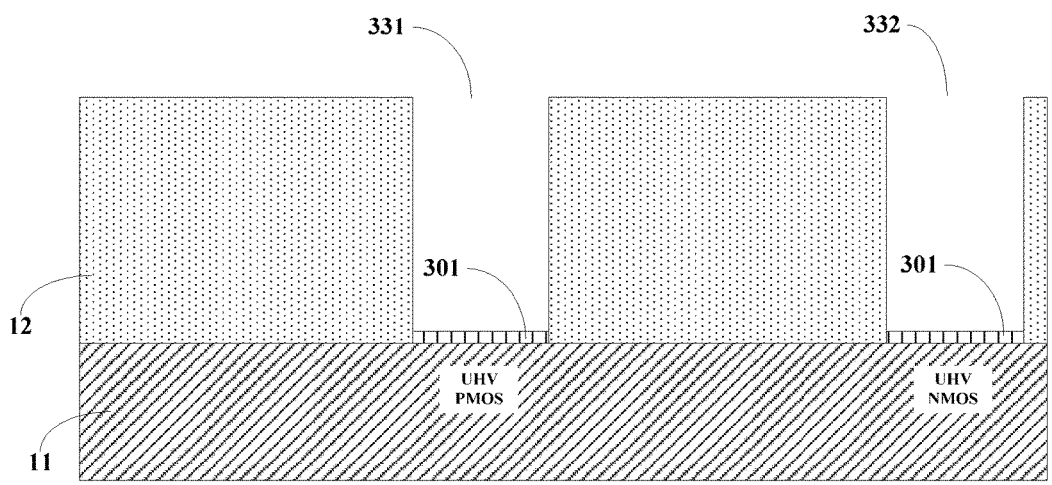

Referring to FIG. 2, FIG. 3A, and FIG. 3B, subsequent to the step S211, the step S212 may include providing an insulating layer 301 (or interface layer 301) in each of the trenches 331 and 332. The insulating layers 301 may directly contact exposed portions of the substrate 11. The insulating layers 301 may be formed using one or more of a thermal oxidation process, a chemical vapor deposition (CVD) process, an atomic layer deposition (ALD) process, a physical vapor deposition (PVD) process, etc. The insulating layers 301 may be formed an oxide material (e.g., a silicon oxide material), such as one or more of a thermal oxide material, a nitrogen oxide material, a chemical oxide material, etc. A thickness of each of the insulating layers 301 may be a few angstroms and/or may be in a range of 5 angstroms to 10 angstroms, such as 7 angstroms.

Figure 3C:
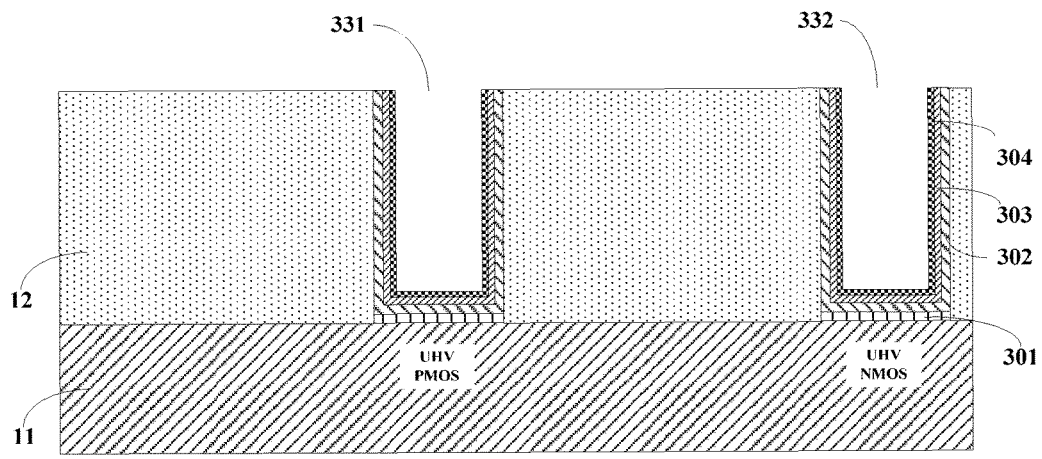

Referring to FIG. 2, FIG. 3B, and FIG. 3C, subsequent to the step S212, the step S213 may include sequentially providing a dielectric layer 302, a cap layer 303, and a barrier layer 304 inside each of the trench 331 and the trench 332. The dielectric layers 302 may be high-k dielectric layers with a dielectric constant greater than 3.9 and/or greater than a dielectric constant of silicon dioxide. Each of the dielectric layers 302, cap layers 303, and barrier layers 304 may be formed using one or more of a CVD process, an ALD process, PVD process, etc. Portions of related materials that protrude outside the trenches 331 and 332 may be removed using, for example, one or more chemical-mechanical planarization (CMP) processes and/or one or more other suitable processes.

The dielectric layers 302 may be formed of one or more of LaO, AlO, BaZrO, HfZrO, HfZrON, HfLaO, HfSiO, HfSiON, LaSiO, AlSiO, HfTaO, HfTiO, $(Ba,Sr)TiO_3$, $Al_2O_3$, $Si_3N_4$, etc. A thickness of each of the dielectric layers 302 may be tens of angstroms and/or may be in a range of 10 angstroms to 30 angstroms, such as 20 angstroms.

The cap layers 303 may be formed of $Ti_xN_{1-x}$ (wherein 0<x<1) and/or one or more other suitable materials. A thickness of each of the cap layers 303 may be in a range of a few angstroms to tens of angstroms and/or may be in a range of 5 angstroms to 20 angstroms, such as 10 angstroms.

The barrier layers 304 may be formed of TaN and/or one or more other suitable materials. A thickness of each of the barrier layers 304 may be in a range of a few angstroms to tens of angstroms and/or may be in a range of 5 angstroms to 20 angstroms, such as 10 angstroms.

Referring to FIG. 2, FIG. 3C, FIG. 3D, and FIG. 3E, subsequent to the step S213, the step S214 may include removing (using a mask 305) the barrier layer 304 and the cap layer 303 that have been provided in the trench 331. The step S214 may include the following steps: providing the mask 305 (e.g., a patterned photoresist), which may cover the trench 332 and may expose the trench 331; performing (e.g., using ozone) one or more oxidation processes on the barrier layer 304 and the cap layer 303 that have been provided in the trench 331; performing (e.g., using $H_2O_2$ and $NH_3OH$; or $H_2O_2$ and HCl) one or more etching processes on the oxidized barrier layer 304 and cap layer 303 to remove the oxidized barrier layer 304 and cap layer 303, such that the dielectric layer 302 inside the trench 331 may be exposed; and removing the mask 305.

In the one or more etching processes, a chemical ratio (e.g., a molar ratio, a concentration ratio, or a mass ratio) of the $H_2O_2$ to the $NH_3OH$ may be in a range of 4 to 6, and/or a chemical ratio (e.g., a molar ratio, a concentration ratio, or a mass ratio) of the $H_2O_2$ to the HCl may be in a range of 4 to 6.

The one or more oxidation processes may maximize the etch rates associated with the barrier layer 304 and cap layer 303 in the one or more etching processes and/or may minimize loss of the dielectric layer 302 inside the trench 331 in the one or more etching processes.

Figure 3D:
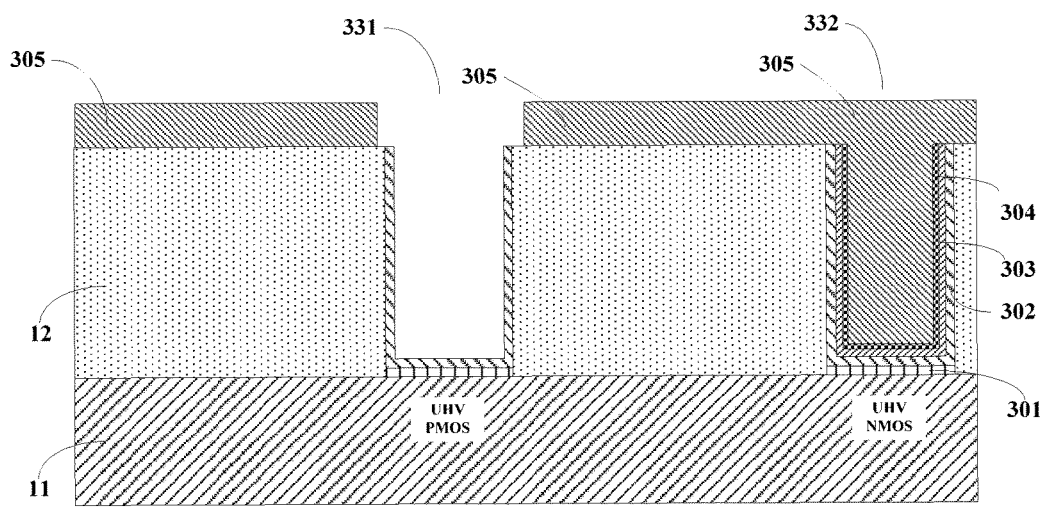
Figure 3E:
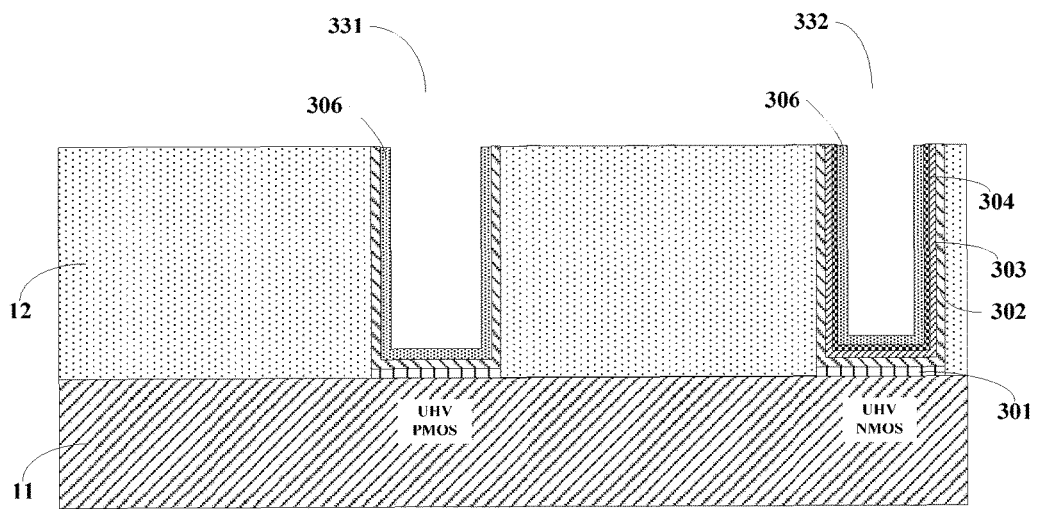

Referring to FIG. 2, FIG. 3D, and FIG. 3E, subsequent to the step S214, the step S215 may include providing a first-type work function layer 306 inside each of the trenches 331 and 332. The first-type work function layer 306 provided inside the trench 331 may directly contact the dielectric layer 302 inside the trench 331. The first-type work function layer 306 provided inside the trench 332 may directly contact the barrier layer 304 inside the trench 332.

The first-type work function layer 306 provided inside the trench 331 may be configured to tune a work function associated with the gate structure of the p-channel device. The first-type work function layers 306 may be formed of one or more of $Ti_xN_{1-x}$, TaC, MoN, TaN, etc. and may be formed using one or more of a CVD process, an ALD process, PVD process, etc. A thickness of each of the first-type work function layers 306 may be in a range of a few angstroms to hundreds of angstroms and/or may be in a range of 10 angstroms to 580 angstroms, such as one or more of 50 angstroms, 100 angstroms, and 300 angstroms.

Figure 3F:
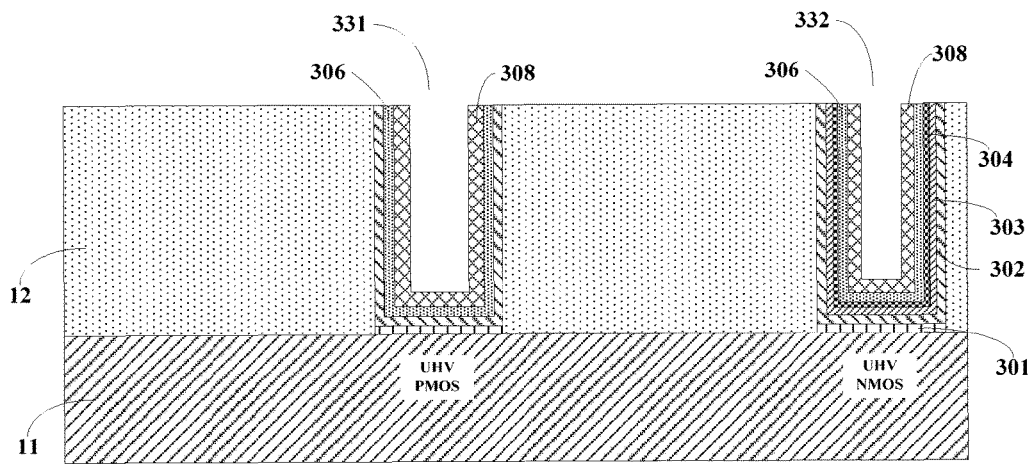

Referring to FIG. 2, FIG. 3E, and FIG. 3F, subsequent to the step S215, the step S216 may include providing a second-type work function layer 308 inside each of the trenches 331 and 332. The second-type work function layer 308 provided inside the trench 331 may directly contact the first-type work function layer 306 inside the trench 331. The second-type work function layer 308 provided inside the trench 332 may directly contact the first-type work function layer 306 inside the trench 332.

The second-type work function layer 308 provided inside the trench 332 may be configured to tune a work function associated with the gate structure of the n-channel device. The second-type work function layer 308 provided inside the trench 331 may not substantially affect the work function associated with the gate structure of the p-channel device. The second-type work function layer 308 provided inside the trench 331 may be removed.

The second-type work function layers 306 may be formed of one or more of TaC, Ti, Al, $Ti_xAl_{1-x}$, etc. and may be formed using one or more of a CVD process, an ALD process, PVD process, etc. A thickness of each of the second-type work function layers 308 may be in a range of a few angstroms to tens of angstroms and/or may be in a range of 10 angstroms to 80 angstroms, such as 50 angstroms.

Figure 3G:
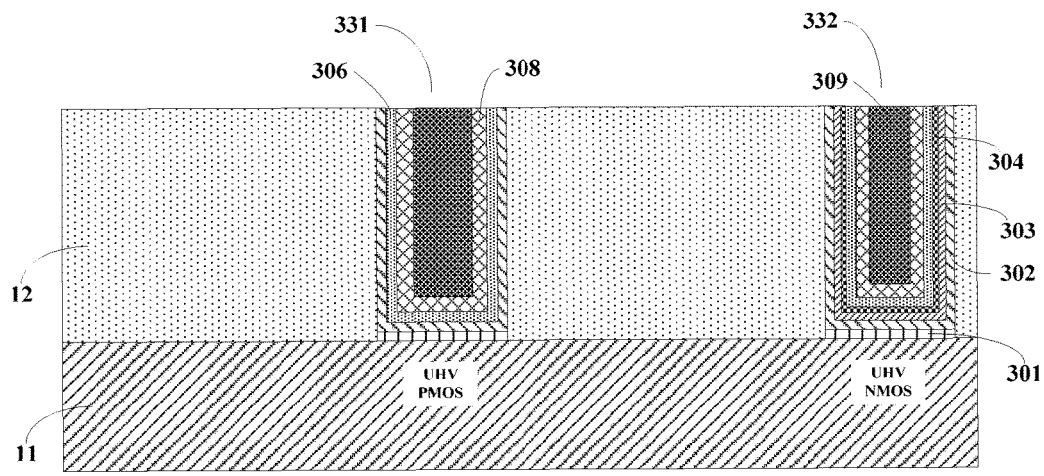

Referring to FIG. 2, FIG. 3F, and FIG. 3G, subsequent to the step S216, the step S217 may include providing a metal member (e.g., an electrode) inside each of the trenches 331 and 332. The metal member 309 provided inside the trench 331 may directly contact the second-type work function layer 308 inside the trench 331. The metal member 309 provided inside the trench 332 may directly contact the second-type work function layer 308 provided inside the trench 332.

The metal members 309 may be formed of one or more of Al, W, etc., and may be formed using one or more of a CVD process, an ALD process, PVD process, etc.

As a result, in the semiconductor device, the UHV PMOS device may include the following elements inside the trench 331: a metal member 309, a dielectric layer 302 positioned between the substrate 11 and the metal member 309, a first-type work function layer 306 directly contacting the dielectric layer 302 and positioned between the dielectric layer 302 and the metal member 309, and a second-type work function layer 308 directly contacting both the first-type work function layer 306 and the metal member 309 and positioned between the first-type work function layer 306 and the metal member 309. The UHV NMOS device may include the following elements inside the trench 332: a metal member 309, a dielectric layer 302 positioned between the substrate 11 and the metal member 309, a barrier layer 304 positioned between the dielectric layer 302 and the metal member 309, a first-type work function layer 306 directly contacting the barrier layer 304 and positioned between the barrier layer 304 and the metal member 309, and a second-type work function layer 308 directly contacting both the first-type work function layer 306 and the metal member 309 and positioned between the first-type work function layer 306 and the metal member 309.

FIG. 4A, FIG. 4B, FIG. 4C, FIG. 4D, FIG. 4E, FIG. 4F, FIG. 4G, and FIG. 4H show schematic diagrams (e.g., schematic cross-sectional views) that illustrate elements and/or structures formed in a step in a method for manufacturing a semiconductor device in accordance with one or more embodiments. Some features of the method and/or the some features of the semiconductor device may be analog to or identical to some features described above with reference to one or more of FIG. 1A to FIG. 3G.

Figure 4A:
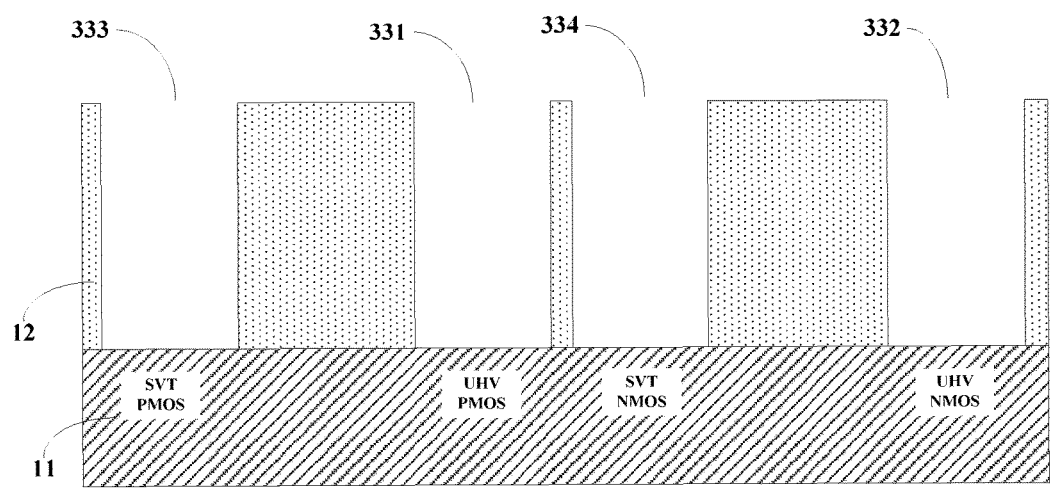
FIG. 4A, FIG. 4B, FIG. 4C, FIG. 4D, FIG. 4E, FIG. 4F, FIG. 4G, and FIG. 4H show schematic diagrams (e.g., schematic cross-sectional views) that illustrate elements and/or structures formed in a step in a method for manufacturing a semiconductor device in accordance with one or more embodiments.

Referring to FIG. 4A, the method may include the following steps: preparing a substrate 11; and preparing a dielectric member 12, which may overlap the substrate 11. The substrate 11 may include two regions designated for two p-channel devices (e.g., a UHV PMOS device and an SVT PMOS device) and may include two regions designated for two n-channel devices (e.g., a UHV NMOS device and an SVT NMOS device). The dielectric member 12 may have a trench 331, a trench 332, a trench 333, and a trench 334, which may be respectively designated for (a gate structure of) the UHV PMOS device, (a gate structure of) the UHV NMOS device, (a gate structure of) the SVT PMOS device, and (a gate structure of) the SVT NMOS device. The trenches 331, 332, 333, and 334 may respectively (partially) expose the four regions of the substrate 11.

Figure 4B:
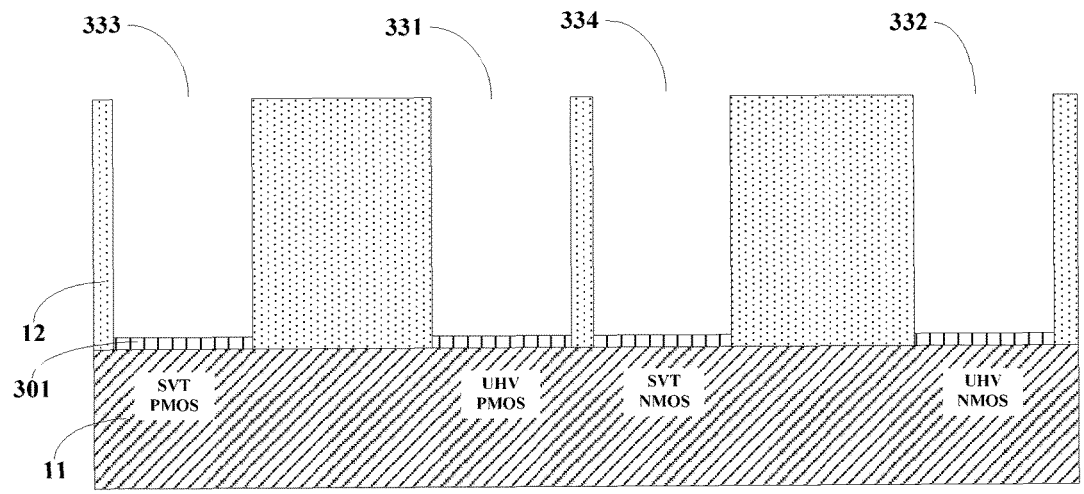

Referring to FIG. 4A and FIG. 4B, the method may include providing an insulating layer 301 (or interface layer 301) in each of the trenches 331, 332, 333, and 334. The insulating layers 301 may directly contact the substrate 11.

Figure 4C:
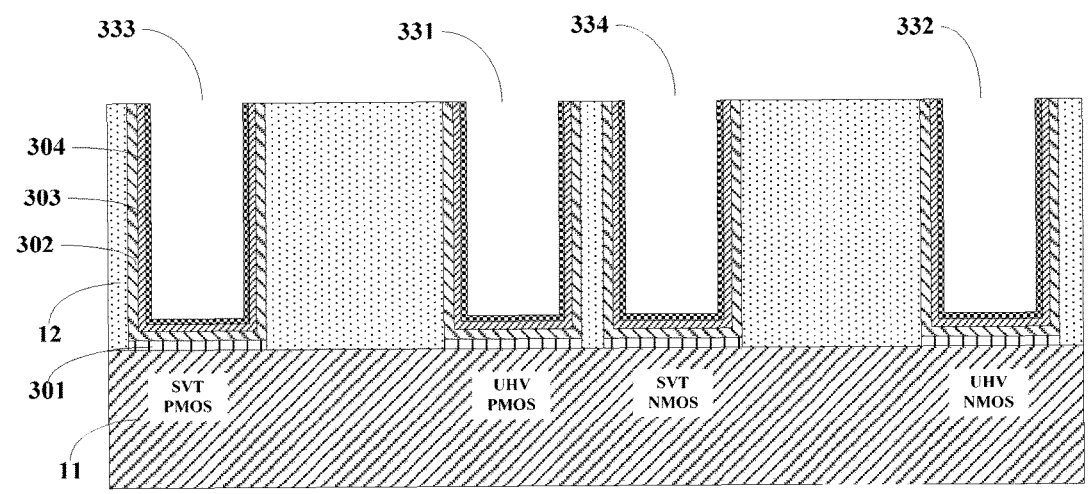

Referring to FIG. 4B and FIG. 4C, the method may include sequentially providing a dielectric layer 302, a cap layer 303, and a barrier layer 304 inside each of the trenches 331, 332, 333, and 334.

Figure 4D:
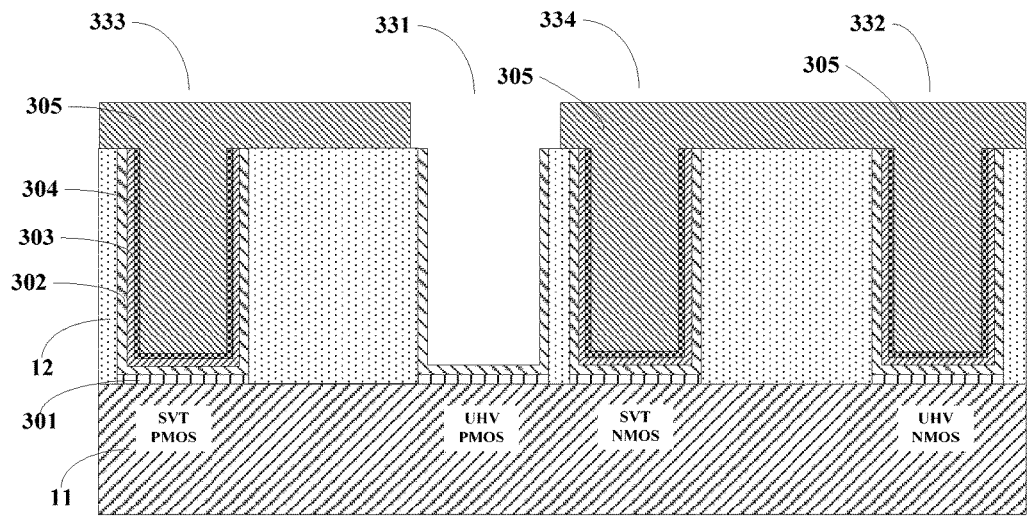

Referring to FIG. 4C and FIG. 4D, the method may include removing the barrier layer 304 and the cap layer 303 that have been provided in the trench 331. The method may include the following steps: providing a mask 305 (e.g., a patterned photoresist), which may cover the trenches 332, 333, and 334 and may expose the trench 331; performing (e.g., using ozone) one or more oxidation processes on the barrier layer 304 and the cap layer 303 that have been provided in the trench 331; performing (e.g., using $H_2O_2$ and $NH_3OH$; or $H_2O_2$ and HCl) one or more etching processes on the oxidized barrier layer 304 and cap layer 303 to remove the oxidized barrier layer 304 and cap layer 303, such that the dielectric layer 302 inside the trench 331 may be exposed; and removing the mask 305.

Figure 4E:
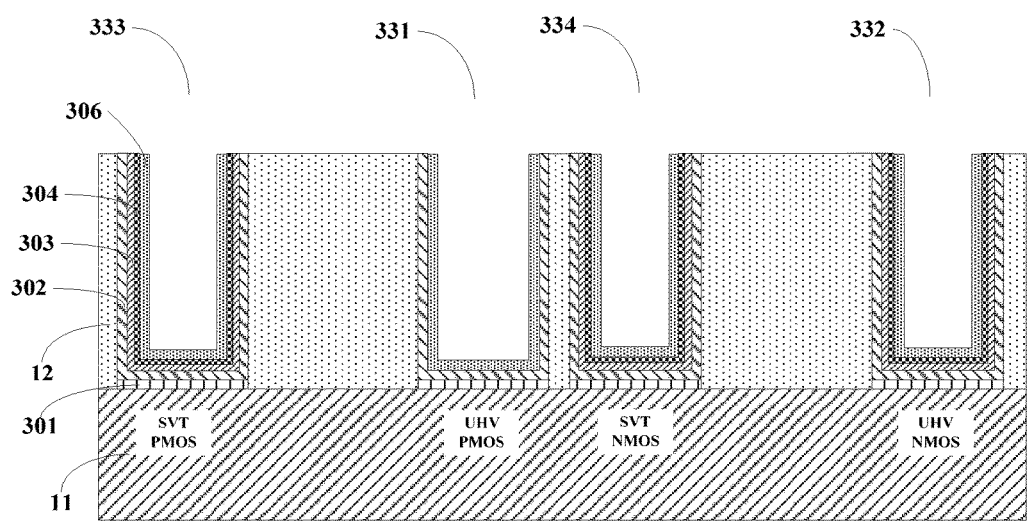

Referring to FIG. 4D and FIG. 4E, the method may include providing a first-type work function layer 306 inside each of the trenches 331, 332, 333, and 334. The first-type work function layer 306 provided inside the trench 331 may directly contact the dielectric layer 302 inside the trench 331. The first-type work function layer 306 provided inside the trench 332 may directly contact the barrier layer 304 inside the trench 332. The first-type work function layer 306 provided inside the trench 333 may directly contact the barrier layer 304 inside the trench 333. The first-type work function layer 306 provided inside the trench 334 may directly contact the barrier layer 304 inside the trench 334.

Figure 4F:
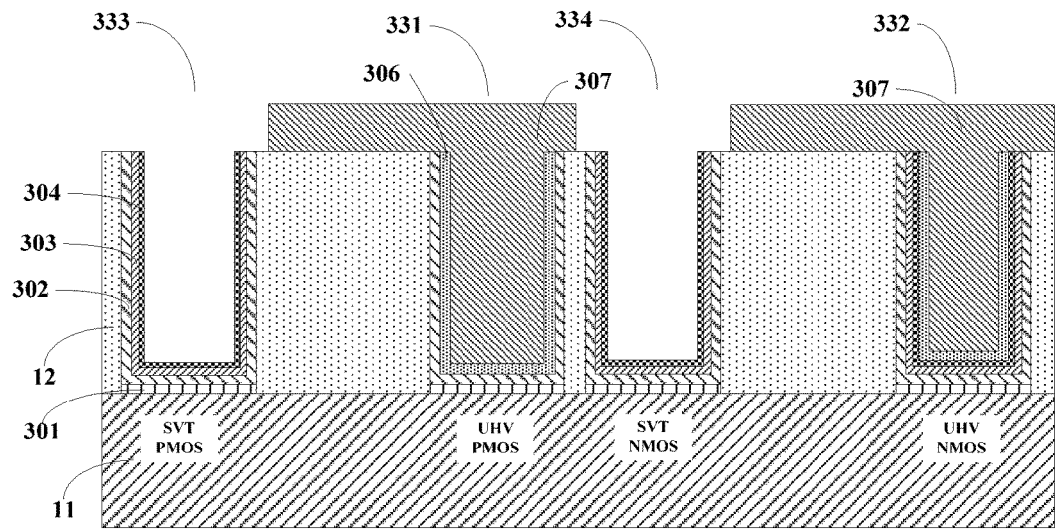
Figure 4G:
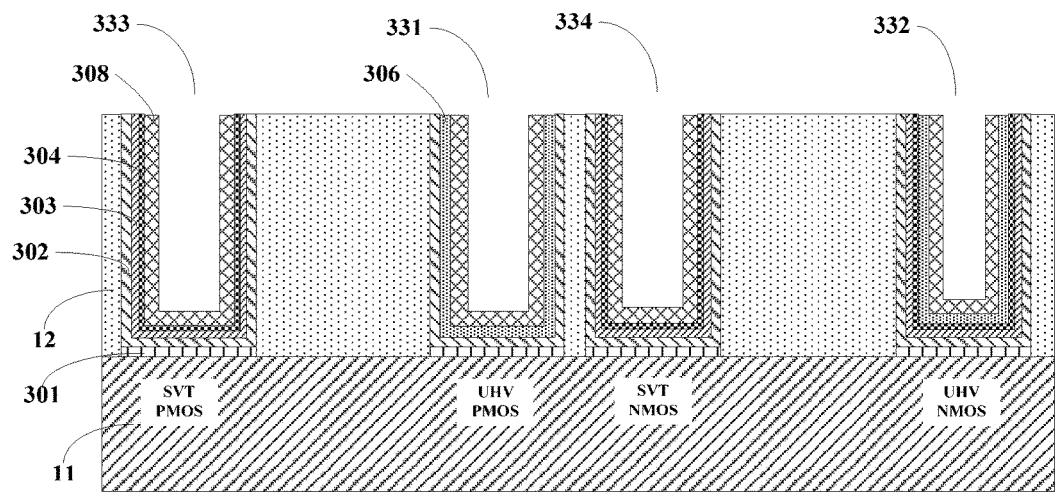

Referring to FIG. 4E, FIG. 4F, and FIG. 4G, the method may include the following steps: removing, using a mask 307 such as a patterned photoresist, the first-type work function layers 306 that have been provided inside the trenches 333 and 334; and removing the mask 307.

Referring to FIG. 4F and FIG. 4G, the method may include providing a second-type work function layer 308 inside each of the trenches 331, 332, 333, and 334. The second-type work function layer 308 provided inside the trench 331 may directly contact the first-type work function layer 306 inside the trench 331. The second-type work function layer 308 provided inside the trench 332 may directly contact the first-type work function layer 306 inside the trench 332. The second-type work function layer 308 provided inside the trench 333 may directly contact the barrier layer 304 inside the trench 333. The second-type work function layer 308 provided inside the trench 334 may directly contact the barrier layer 304 inside the trench 334.

Figure 4H:
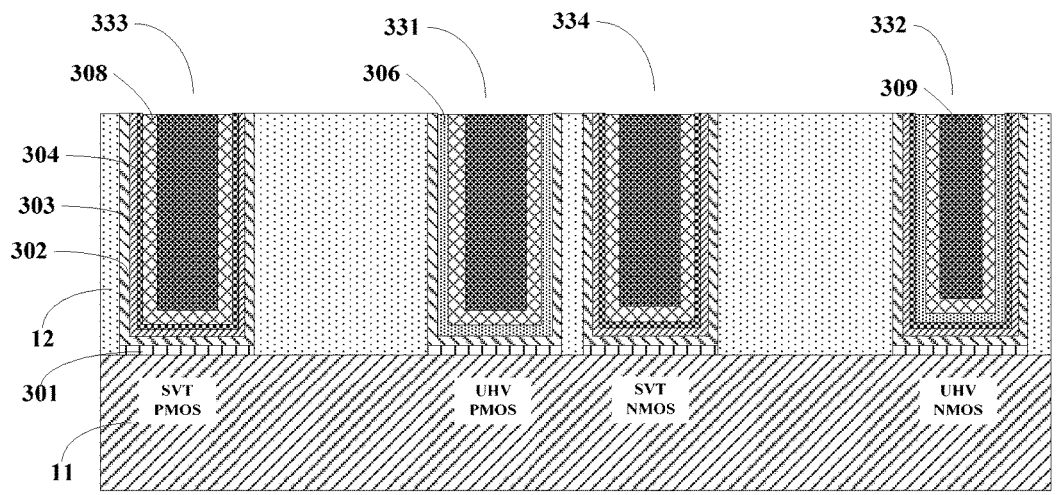

Referring to FIG. 4F and FIG. 4H, the method may include providing a metal member (e.g., an electrode) inside each of the trenches 331, 332, 333, and 334. The metal member 309 provided inside the trench 331 may directly contact the second-type work function layer 308 inside the trench 331. The metal member 309 provided inside the trench 332 may directly contact the second-type work function layer 308 provided inside the trench 332. The metal member 309 provided inside the trench 333 may directly contact the second-type work function layer 308 inside the trench 333. The metal member 309 provided inside the trench 334 may directly contact the second-type work function layer 308 provided inside the trench 334.

As a result, in the semiconductor device, the UHV PMOS device may include the following elements inside the trench 331: a metal member 309, a dielectric layer 302 positioned between the substrate 11 and the metal member 309, a first-type work function layer 306 directly contacting the dielectric layer 302 and positioned between the dielectric layer 302 and the metal member 309, and a second-type work function layer 308 directly contacting both the first-type work function layer 306 and the metal member 309 and positioned between the first-type work function layer 306 and the metal member 309.

The UHV NMOS device may include the following elements inside the trench 332: a metal member 309, a dielectric layer 302 positioned between the substrate 11 and the metal member 309, a barrier layer 304 positioned between the dielectric layer 302 and the metal member 309, a first-type work function layer 306 directly contacting the barrier layer 304 and positioned between the barrier layer 304 and the metal member 309, and a second-type work function layer 308 directly contacting both the first-type work function layer 306 and the metal member 309 and positioned between the first-type work function layer 306 and the metal member 309.

The SVT PMOS device may include the following elements inside the trench 333: a metal member 309, a dielectric layer 302 positioned between the substrate 11 and the metal member 309, a barrier layer 304 positioned between the dielectric layer 302 and the metal member 309, and a second-type work function layer 308 directly contacting both the barrier layer 304 and the metal member 309 and positioned between the barrier layer 304 and the metal member 309.

The SVT NMOS device may include the following elements inside the trench 334: a metal member 309, a dielectric layer 302 positioned between the substrate 11 and the metal member 309, a barrier layer 304 positioned between the dielectric layer 302 and the metal member 309, and a second-type work function layer 308 directly contacting both the barrier layer 304 and the metal member 309 and positioned between the barrier layer 304 and the metal member 309.

Based on the work function structures of the devices, a threshold voltage of the UHV PMOS device may be higher than a threshold voltage of the SVT PMOS device, and a threshold voltage of the UHV NMOS device may be higher than a threshold voltage of the SVT NMOS device.

FIG. 5A, FIG. 5B, FIG. 5C, FIG. 5D, FIG. 5E, FIG. 5F, FIG. 5G, and FIG. 5H show schematic diagrams (e.g., schematic cross-sectional views) that illustrate elements and/or structures formed in a step in a method for manufacturing a semiconductor device in accordance with one or more embodiments. Some features of the method and/or the some features of the semiconductor device may be analog to or identical to some features described above with reference to one or more of FIG. 1A to FIG. 4H.

Figure 5A:
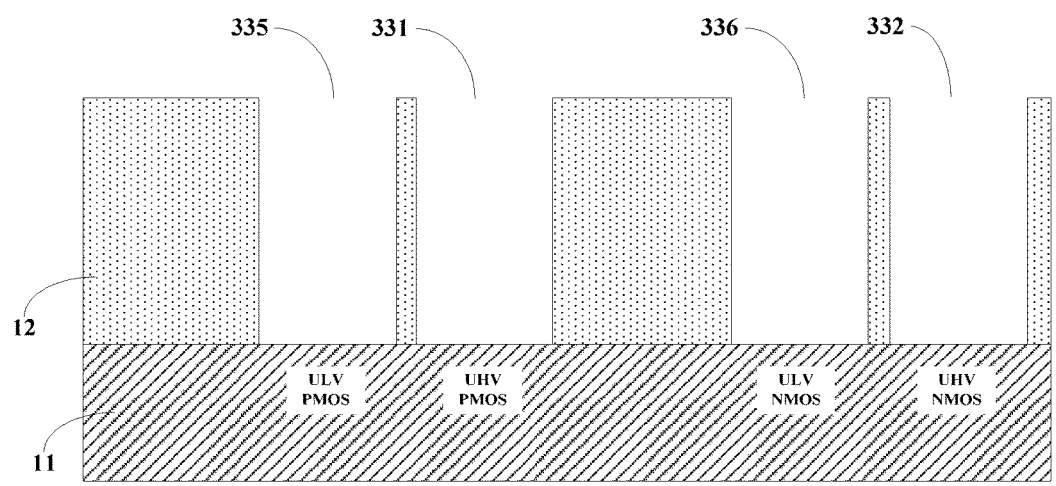
FIG. 5A, FIG. 5B, FIG. 5C, FIG. 5D, FIG. 5E, FIG. 5F, FIG. 5G, and FIG. 5H show schematic diagrams (e.g., schematic cross-sectional views) that illustrate elements and/or structures formed in a step in a method for manufacturing a semiconductor device in accordance with one or more embodiments.

Referring to FIG. 5A, the method may include the following steps: preparing a substrate 11; and preparing a dielectric member 12, which may overlap the substrate 11. The substrate 11 may include two regions designated for two p-channel devices (e.g., a UHV PMOS device and a ULV PMOS device) and may include two regions designated for two n-channel devices (e.g., a UHV NMOS device and a ULV NMOS device). The dielectric member 12 may have a trench 331, a trench 332, a trench 335, and a trench 336, which may be respectively designated for (a gate structure of) the UHV PMOS device, (a gate structure of) the UHV NMOS device, (a gate structure of) the ULV PMOS device, and (a gate structure of) the ULV NMOS device. The trenches 331, 332, 335, and 336 may respectively (partially) expose the four regions of the substrate 11.

Figure 5B:
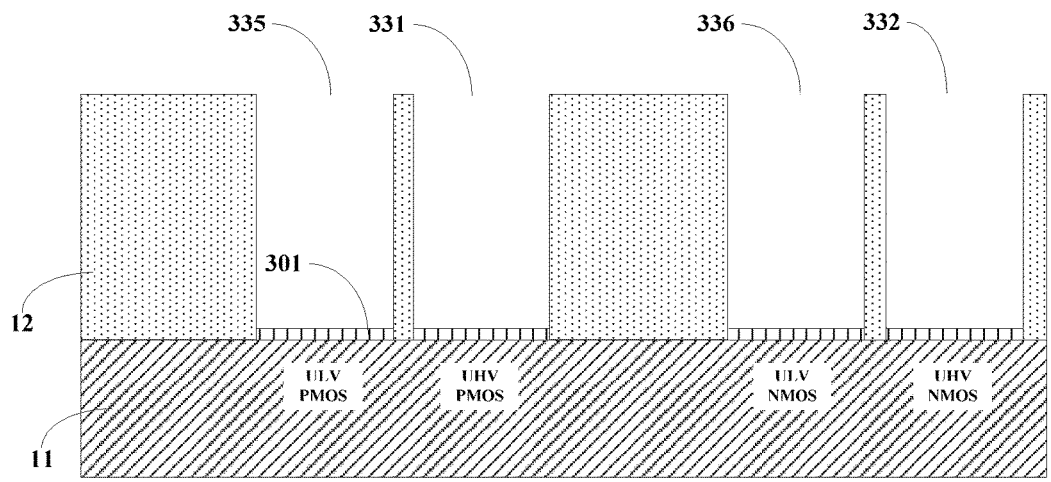

Referring to FIG. 5A and FIG. 5B, the method may include providing an insulating layer 301 (or interface layer 301) in each of the trenches 331, 332, 335, and 336. The insulating layers 301 may directly contact the substrate 11.

Figure 5C:
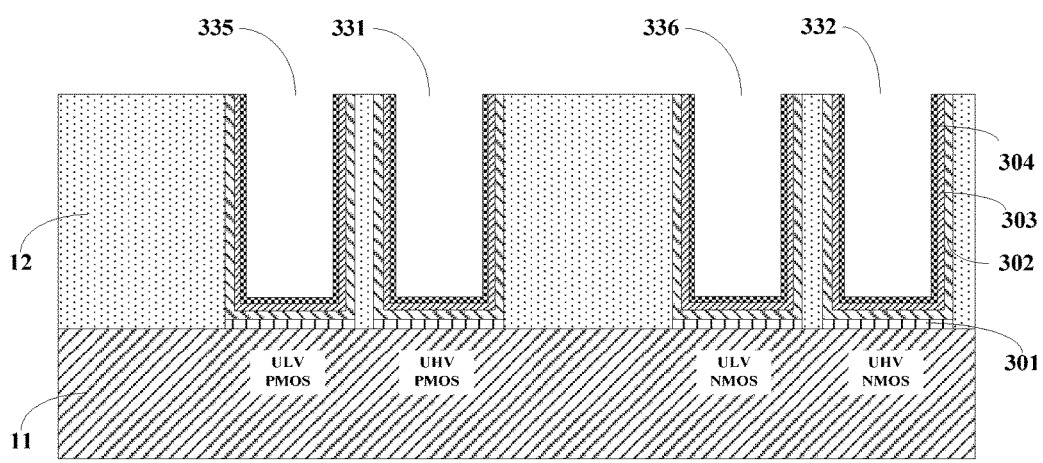

Referring to FIG. 5B and FIG. 5C, the method may include sequentially providing a dielectric layer 302, a cap layer 303, and a barrier layer 304 inside each of the trenches 331, 332, 335, and 336.

Figure 5D:
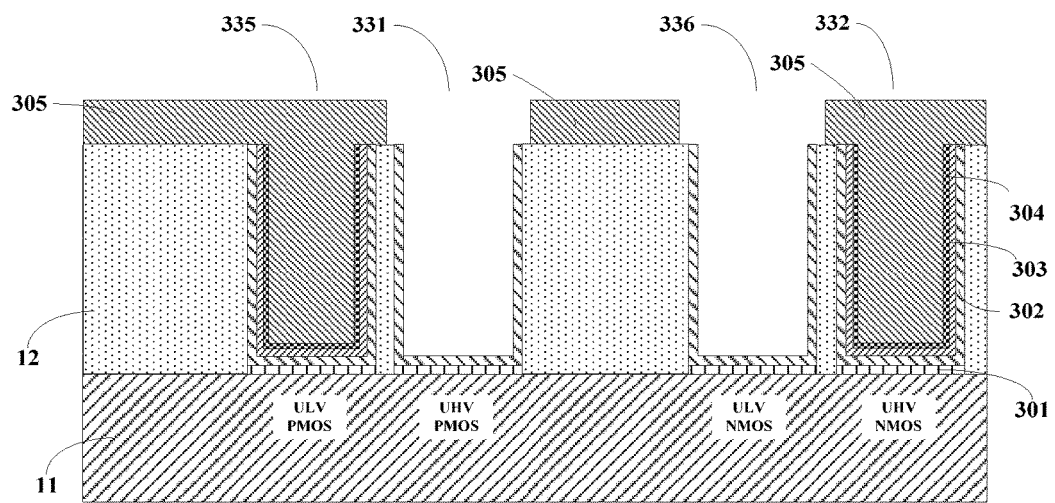

Referring to FIG. 5C and FIG. 5D, the method may include removing the barrier layers 304 and the cap layers 303 that have been provided in the trenches 331 and 336. The method may include the following steps: providing a mask 305 (e.g., a patterned photoresist), which may cover the trenches 332 and 335 and may expose the trench 331 and 336; performing (e.g., using ozone) one or more oxidation processes on the layers 304 and 303 that have been provided in the trenches 331 and 336; performing (e.g., using $H_2O_2$ and $NH_3OH$; or $H_2O_2$ and HCl) one or more etching processes on the oxidized layers 304 and 303 to remove the oxidized barrier layers 304 and 303, such that the dielectric layers 302 inside the trenches 331 and 336 may be exposed; and removing the mask 305.

Figure 5E:
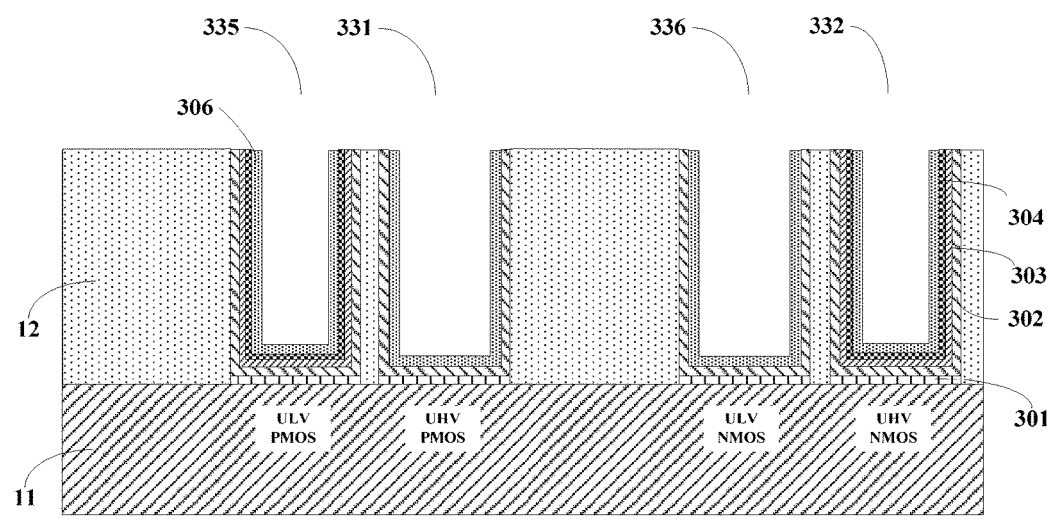

Referring to FIG. 5D and FIG. 5E, the method may include providing a first-type work function layer 306 inside each of the trenches 331, 332, 335, and 336. The first-type work function layer 306 provided inside the trench 331 may directly contact the dielectric layer 302 inside the trench 331. The first-type work function layer 306 provided inside the trench 332 may directly contact the barrier layer 304 inside the trench 332. The first-type work function layer 306 provided inside the trench 335 may directly contact the barrier layer 304 inside the trench 335. The first-type work function layer 306 provided inside the trench 336 may directly contact the dielectric layer 302 inside the trench 336.

Figure 5F:
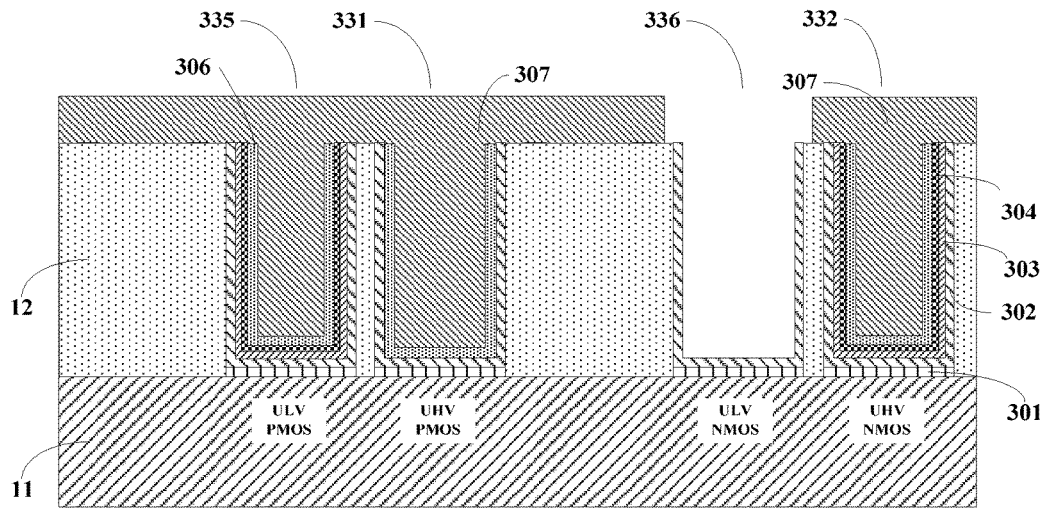
Figure 5G:
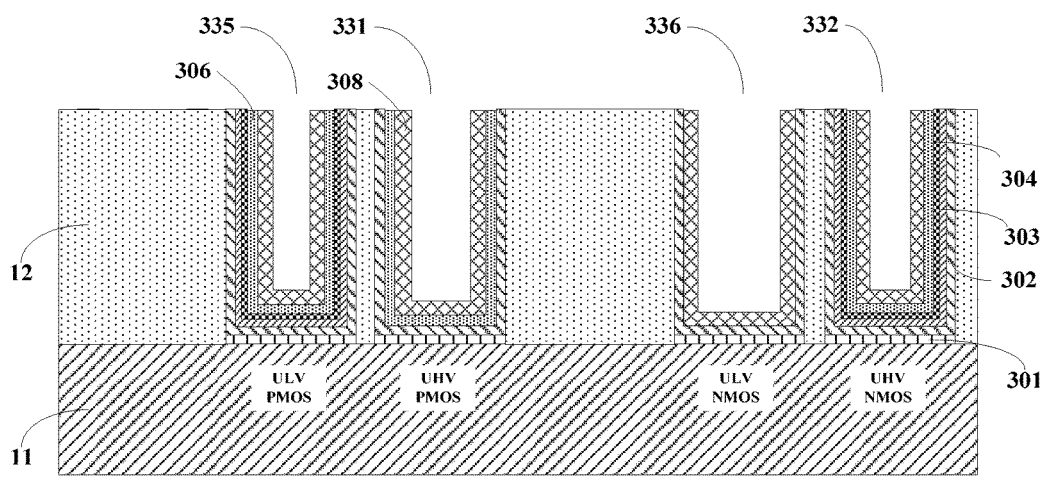

Referring to FIG. 5E, FIG. 5F, and FIG. 5G, the method may include the following steps: removing, using a mask 307, the first-type work function layer 306 that have been provided inside the trench 336; and removing the mask 307.

Referring to FIG. 5F and FIG. 5G, the method may include providing a second-type work function layer 308 inside each of the trenches 331, 332, 335, and 336. The second-type work function layer 308 provided inside the trench 331 may directly contact the first-type work function layer 306 inside the trench 331. The second-type work function layer 308 provided inside the trench 332 may directly contact the first-type work function layer 306 inside the trench 332. The second-type work function layer 308 provided inside the trench 335 may directly contact the first-type work function layer 306 inside the trench 335. The second-type work function layer 308 provided inside the trench 336 may directly contact the dielectric layer 302 inside the trench 336.

Figure 5H:
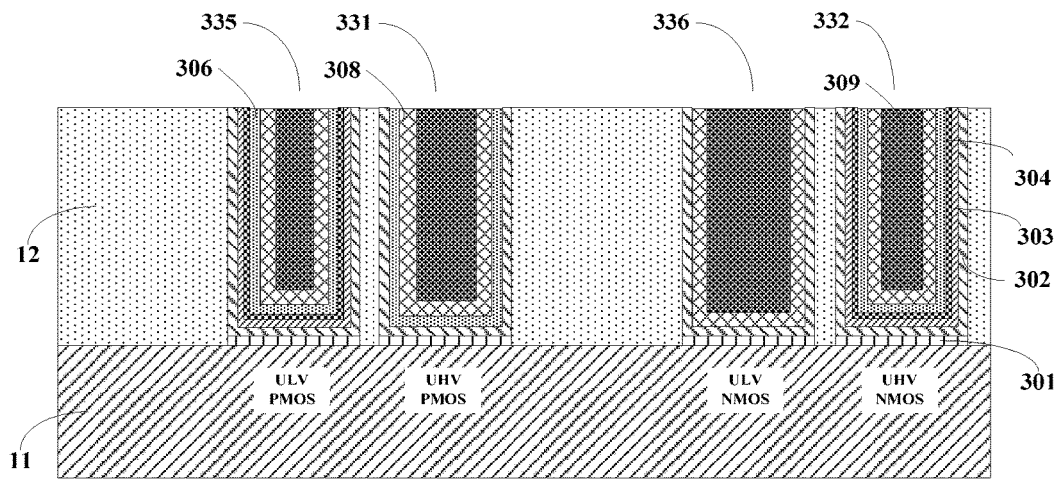

Referring to FIG. 5F and FIG. 5H, the method may include providing a metal member (e.g., an electrode) inside each of the trenches 331, 332, 335, and 336. The metal member 309 provided inside the trench 331 may directly contact the second-type work function layer 308 inside the trench 331. The metal member 309 provided inside the trench 332 may directly contact the second-type work function layer 308 provided inside the trench 332. The metal member 309 provided inside the trench 335 may directly contact the second-type work function layer 308 inside the trench 335. The metal member 309 provided inside the trench 336 may directly contact the second-type work function layer 308 provided inside the trench 336.

As a result, in the semiconductor device, the UHV PMOS device may include the following elements inside the trench 331: a metal member 309, a dielectric layer 302 positioned between the substrate 11 and the metal member 309, a first-type work function layer 306 directly contacting the dielectric layer 302 and positioned between the dielectric layer 302 and the metal member 309, and a second-type work function layer 308 directly contacting both the first-type work function layer 306 and the metal member 309 and positioned between the first-type work function layer 306 and the metal member 309.

The UHV NMOS device may include the following elements inside the trench 332: a metal member 309, a dielectric layer 302 positioned between the substrate 11 and the metal member 309, a barrier layer 304 positioned between the dielectric layer 302 and the metal member 309, a first-type work function layer 306 directly contacting the barrier layer 304 and positioned between the barrier layer 304 and the metal member 309, and a second-type work function layer 308 directly contacting both the first-type work function layer 306 and the metal member 309 and positioned between the first-type work function layer 306 and the metal member 309.

The ULV PMOS device may include the following elements inside the trench 335: a metal member 309, a dielectric layer 302 positioned between the substrate 11 and the metal member 309, a barrier layer 304 positioned between the dielectric layer 302 and the metal member 309, a first-type work function layer 306 directly contacting the barrier layer 304 and positioned between the barrier layer 304 and the metal member 309, and a second-type work function layer 308 directly contacting both the first-type work function layer 306 and the metal member 309 and positioned between the first-type work function layer 306 and the metal member 309.

The ULV NMOS device may include the following elements inside the trench 336: a metal member 309, a dielectric layer 302 positioned between the substrate 11 and the metal member 309, and a second-type work function layer 308 directly contacting both the dielectric layer 302 and the metal member 309 and positioned between the dielectric layer 302 and the metal member 309.

Based on the work function structures of the devices, a threshold voltage of the UHV PMOS device may be higher than a threshold voltage of the ULV PMOS device, and a threshold voltage of the UHV NMOS device may be higher than a threshold voltage of the ULV NMOS device.

FIG. 6A, FIG. 6B, FIG. 6C, FIG. 6D, FIG. 6E, FIG. 6F, FIG. 6G, and FIG. 6H show schematic diagrams (e.g., schematic cross-sectional views) that illustrate elements and/or structures formed in a step in a method for manufacturing a semiconductor device in accordance with one or more embodiments. Some features of the method and/or the some features of the semiconductor device may be analog to or identical to some features described above with reference to one or more of FIG. 1A to FIG. 5H.

Figure 6A:
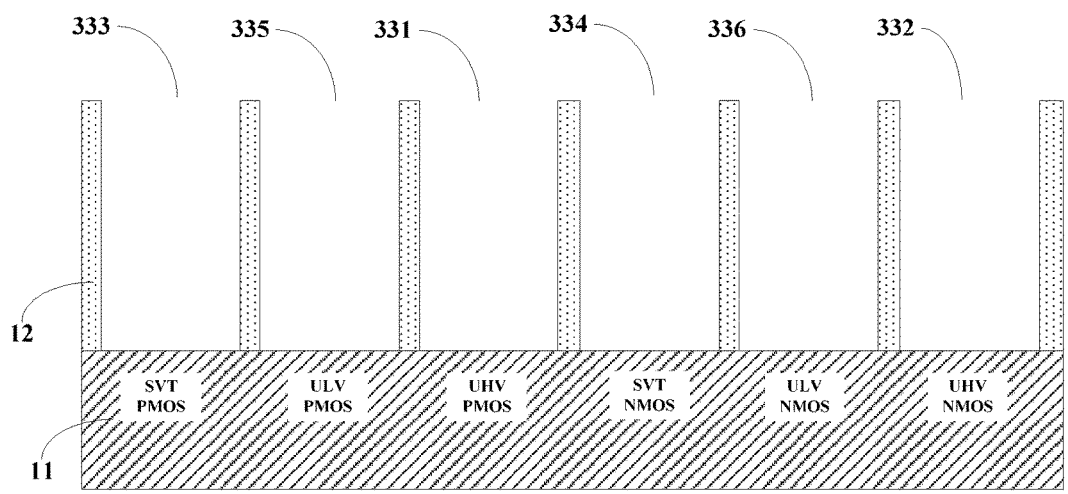
FIG. 6A, FIG. 6B, FIG. 6C, FIG. 6D, FIG. 6E, FIG. 6F, FIG. 6G, and FIG. 6H show schematic diagrams (e.g., schematic cross-sectional views) that illustrate elements and/or structures formed in a step in a method for manufacturing a semiconductor device in accordance with one or more embodiments.

Referring to FIG. 6A, the method may include the following steps: preparing a substrate 11; and preparing a dielectric member 12, which may overlap the substrate 11. The substrate 11 may include three regions designated for three p-channel devices (e.g., a UHV PMOS device, an SVT PMOS device, and a ULV PMOS device) and may include three regions designated for three n-channel devices (e.g., a UHV NMOS device, an SVT NMOS device, and a ULV NMOS device). The dielectric member 12 may have a trench 331, a trench 332, a trench 333, a trench 334, a trench 335, and a trench 336, which may be respectively designated for (a gate structure of) the UHV PMOS device, (a gate structure of) the UHV NMOS device, (a gate structure of) the SVT PMOS device, (a gate structure of) the SVT NMOS device, (a gate structure of) the ULV PMOS device, and (a gate structure of) the ULV NMOS device. The trenches 331, 332, 333, 334, 335, and 336 may respectively (partially) expose the six regions of the substrate 11.

Figure 6B:
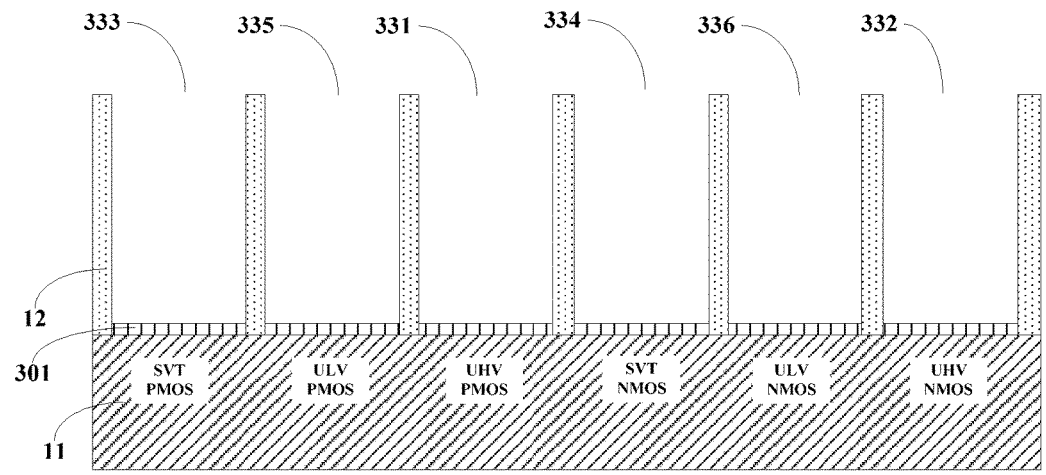

Referring to FIG. 6A and FIG. 6B, the method may include providing an insulating layer 301 (or interface layer 301) in each of the trenches 331, 332, 333, 334, 335, and 336. The insulating layers 301 may directly contact the substrate 11.

Figure 6C:
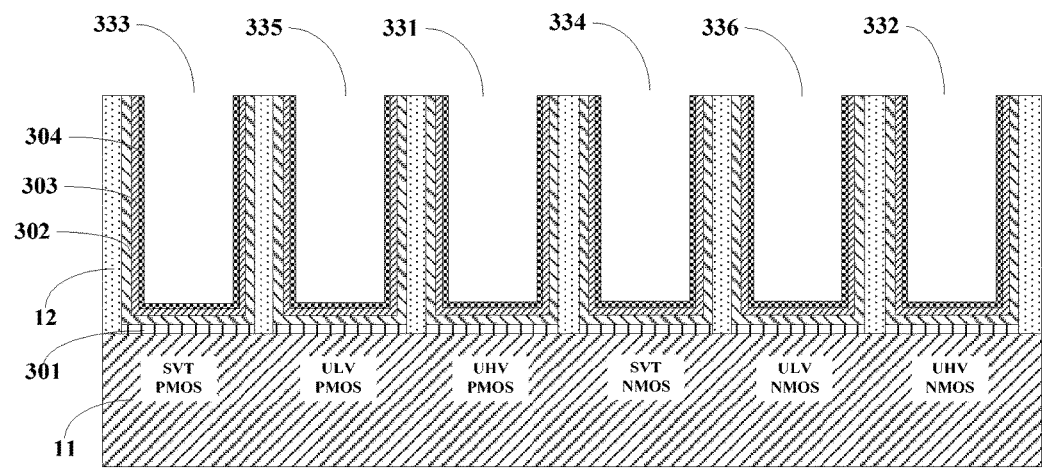

Referring to FIG. 6B and FIG. 6C, the method may include sequentially providing a dielectric layer 302, a cap layer 303, and a barrier layer 304 inside each of the trenches 331, 332, 333, 334, 335, and 336.

Figure 6D:
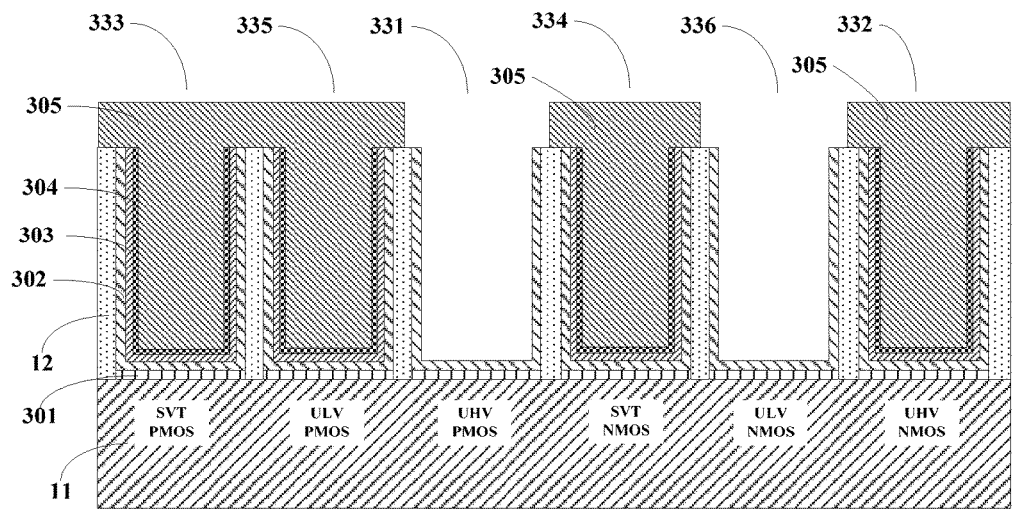

Referring to FIG. 6C and FIG. 6D, the method may include removing the barrier layers 304 and the cap layers 303 that have been provided in the trenches 331 and 336. The method may include the following steps: providing a mask 305 (e.g., a patterned photoresist), which may cover the trenches 332 and 335 and may expose the trench 331 and 336; performing (e.g., using ozone) one or more oxidation processes on the layers 304 and 303 that have been provided in the trenches 331 and 336; performing (e.g., using $H_2O_2$ and $NH_3OH$; or $H_2O_2$ and HCl) one or more etching processes on the oxidized layers 304 and 303 to remove the oxidized barrier layers 304 and 303, such that the dielectric layers 302 inside the trenches 331 and 336 may be exposed; and removing the mask 305.

Figure 6E:
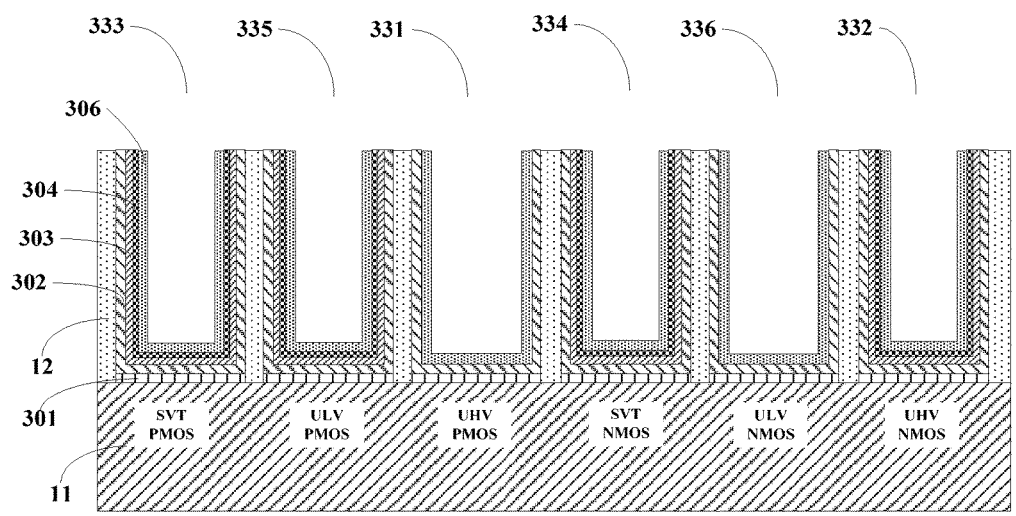

Referring to FIG. 6D and FIG. 6E, the method may include providing a first-type work function layer 306 inside each of the trenches 331, 332, 333, 334, 335, and 336. The first-type work function layer 306 provided inside the trench 331 may directly contact the dielectric layer 302 inside the trench 331. The first-type work function layer 306 provided inside the trench 332 may directly contact the barrier layer 304 inside the trench 332. The first-type work function layer 306 provided inside the trench 333 may directly contact the barrier layer 304 inside the trench 333. The first-type work function layer 306 provided inside the trench 334 may directly contact the barrier layer 304 inside the trench 334. The first-type work function layer 306 provided inside the trench 335 may directly contact the barrier layer 304 inside the trench 335. The first-type work function layer 306 provided inside the trench 336 may directly contact the dielectric layer 302 inside the trench 336.

Figure 6F:
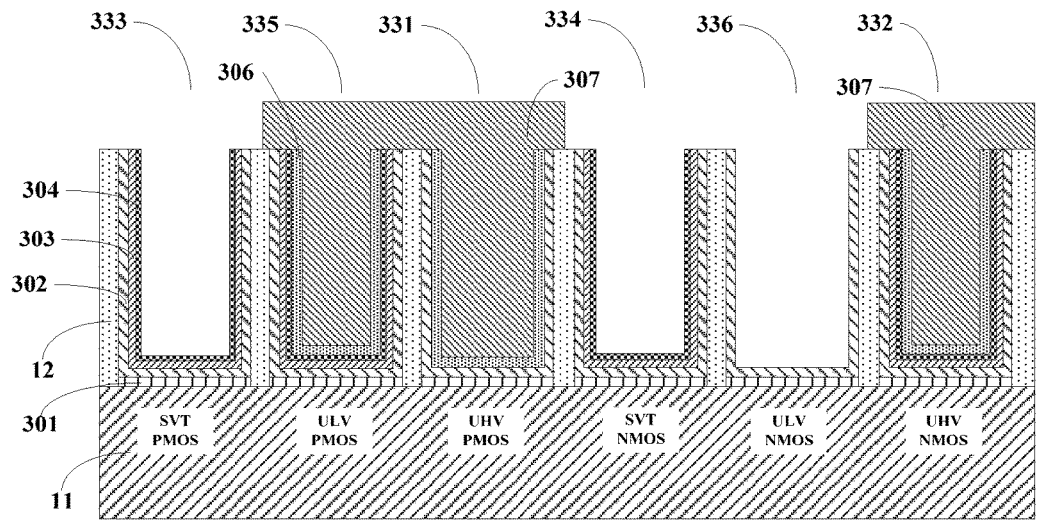
Figure 6G:
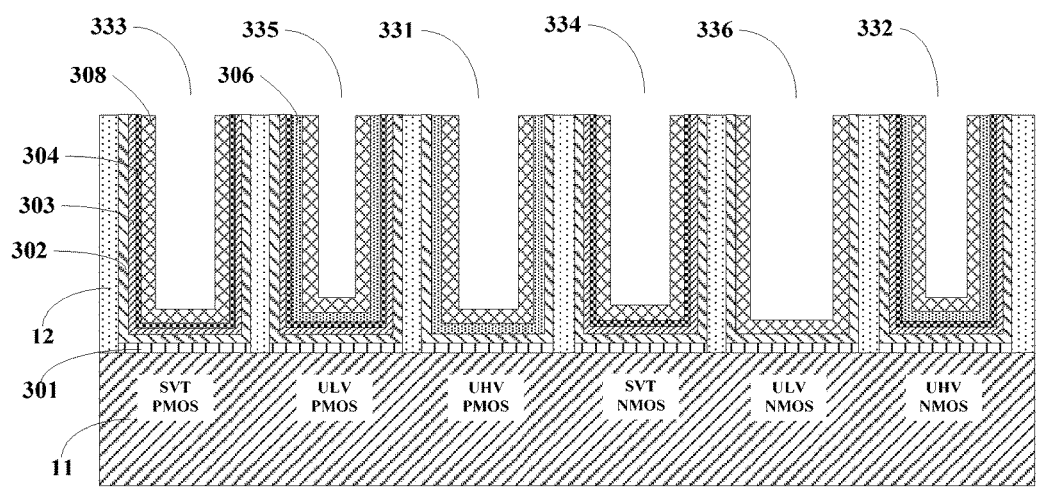

Referring to FIG. 6E, FIG. 6F, and FIG. 6G, the method may include the following steps: removing, using a mask 307, the first-type work function layers 306 that have been provided inside the trenches 333, 334, and 336; and removing the mask 307.

Referring to FIG. 6F and FIG. 6G, the method may include providing a second-type work function layer 308 inside each of the trenches 331, 332, 333, 334, 335, and 336. The second-type work function layer 308 provided inside the trench 331 may directly contact the first-type work function layer 306 inside the trench 331. The second-type work function layer 308 provided inside the trench 332 may directly contact the first-type work function layer 306 inside the trench 332. The second-type work function layer 308 provided inside the trench 333 may directly contact the barrier layer 304 inside the trench 333. The second-type work function layer 308 provided inside the trench 334 may directly contact the barrier layer 304 inside the trench 334. The second-type work function layer 308 provided inside the trench 335 may directly contact the first-type work function layer 306 inside the trench 335. The second-type work function layer 308 provided inside the trench 336 may directly contact the dielectric layer 302 inside the trench 336.

Figure 6H:
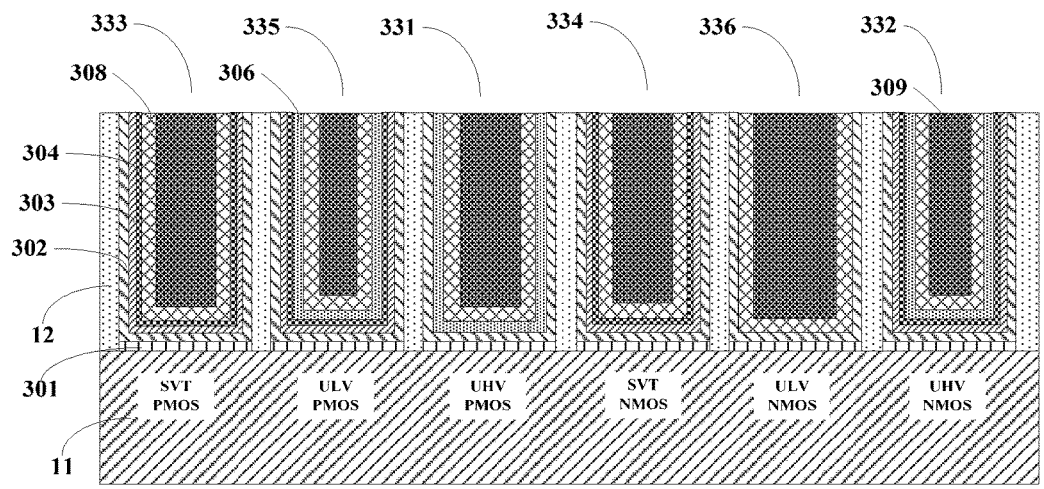

Referring to FIG. 6F and FIG. 6H, the method may include providing a metal member (e.g., an electrode) inside each of the trenches 331, 332, 333, 334, 335, and 336. The metal member 309 provided inside the trench 331 may directly contact the second-type work function layer 308 inside the trench 331. The metal member 309 provided inside the trench 332 may directly contact the second-type work function layer 308 provided inside the trench 332. The metal member 309 provided inside the trench 333 may directly contact the second-type work function layer 308 inside the trench 333. The metal member 309 provided inside the trench 334 may directly contact the second-type work function layer 308 provided inside the trench 334. The metal member 309 provided inside the trench 335 may directly contact the second-type work function layer 308 inside the trench 335. The metal member 309 provided inside the trench 336 may directly contact the second-type work function layer 308 provided inside the trench 336.

As a result, in the semiconductor device, the UHV PMOS device may include the following elements inside the trench 331: a metal member 309, a dielectric layer 302 positioned between the substrate 11 and the metal member 309, a first-type work function layer 306 directly contacting the dielectric layer 302 and positioned between the dielectric layer 302 and the metal member 309, and a second-type work function layer 308 directly contacting both the first-type work function layer 306 and the metal member 309 and positioned between the first-type work function layer 306 and the metal member 309.

The UHV NMOS device may include the following elements inside the trench 332: a metal member 309, a dielectric layer 302 positioned between the substrate 11 and the metal member 309, a barrier layer 304 positioned between the dielectric layer 302 and the metal member 309, a first-type work function layer 306 directly contacting the barrier layer 304 and positioned between the barrier layer 304 and the metal member 309, and a second-type work function layer 308 directly contacting both the first-type work function layer 306 and the metal member 309 and positioned between the first-type work function layer 306 and the metal member 309.

The SVT PMOS device may include the following elements inside the trench 333: a metal member 309, a dielectric layer 302 positioned between the substrate 11 and the metal member 309, a barrier layer 304 positioned between the dielectric layer 302 and the metal member 309, and a second-type work function layer 308 directly contacting both the barrier layer 304 and the metal member 309 and positioned between the barrier layer 304 and the metal member 309.

The SVT NMOS device may include the following elements inside the trench 334: a metal member 309, a dielectric layer 302 positioned between the substrate 11 and the metal member 309, a barrier layer 304 positioned between the dielectric layer 302 and the metal member 309, and a second-type work function layer 308 directly contacting both the barrier layer 304 and the metal member 309 and positioned between the barrier layer 304 and the metal member 309.

The ULV PMOS device may include the following elements inside the trench 335: a metal member 309, a dielectric layer 302 positioned between the substrate 11 and the metal member 309, a barrier layer 304 positioned between the dielectric layer 302 and the metal member 309, a first-type work function layer 306 directly contacting the barrier layer 304 and positioned between the barrier layer 304 and the metal member 309, and a second-type work function layer 308 directly contacting both the first-type work function layer 306 and the metal member 309 and positioned between the first-type work function layer 306 and the metal member 309.

The ULV NMOS device may include the following elements inside the trench 336: a metal member 309, a dielectric layer 302 positioned between the substrate 11 and the metal member 309, and a second-type work function layer 308 directly contacting both the dielectric layer 302 and the metal member 309 and positioned between the dielectric layer 302 and the metal member 309.

Based on the work function structures of the devices, a threshold voltage of the UHV PMOS device may be higher than a threshold voltage of the SVT PMOS device, a threshold voltage of the UHV NMOS device may be higher than a threshold voltage of the SVT NMOS device, a threshold voltage of the ULV PMOS device may be lower than a threshold voltage of the SVT PMOS device, and a threshold voltage of the ULV NMOS device may be lower than a threshold voltage of the SVT NMOS device.

Figure 7:
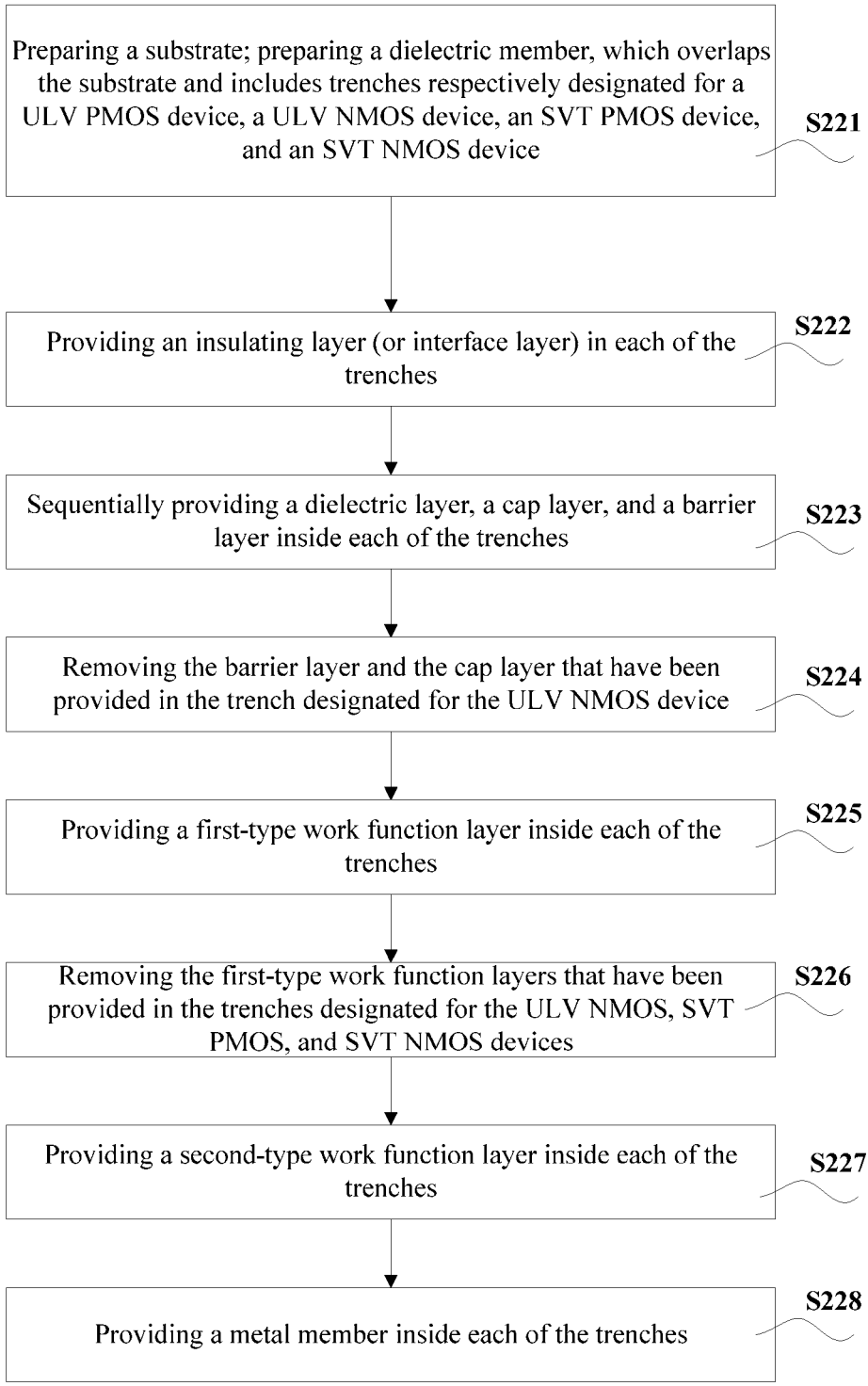
FIG. 7 shows a flowchart that illustrates steps in a method for manufacturing a semiconductor device in accordance with one or more embodiments.

FIG. 7 shows a flowchart that illustrates steps in a method for manufacturing a semiconductor device in accordance with one or more embodiments. FIG. 8A, FIG. 8B, FIG. 8C, FIG. 8D, FIG. 8E, FIG. 8F, FIG. 8G, and FIG. 8H show schematic diagrams (e.g., schematic cross-sectional views) that illustrate elements and/or structures formed in a step in the method for manufacturing a semiconductor device in accordance with one or more embodiments. Some features of the method and/or the some features of the semiconductor device may be analog to or identical to some features described above with reference to one or more of FIG. 1A to FIG. 6H.

Referring to FIG. 7, the method may include steps S221, S222, S223, S224, S225, S226, S227, and S228.

Figure 8A:
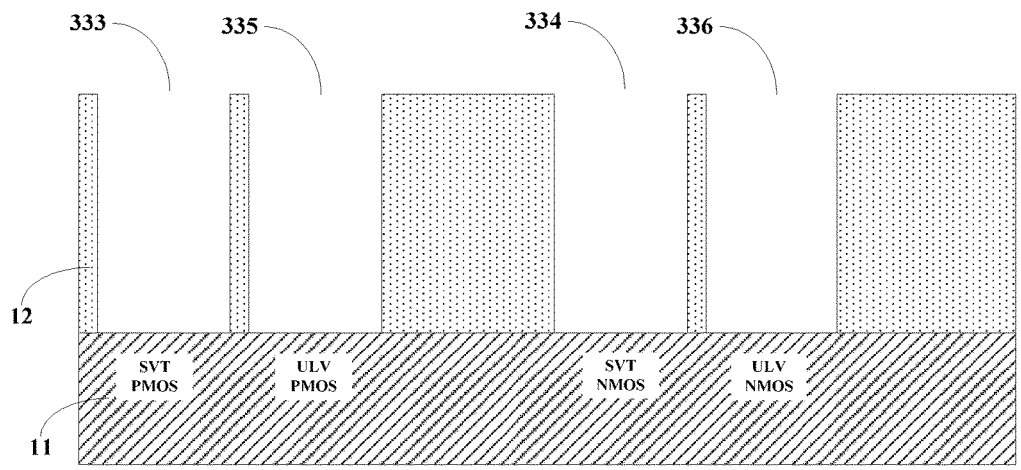
FIG. 8A, FIG. 8B, FIG. 8C, FIG. 8D, FIG. 8E, FIG. 8F, FIG. 8G, and FIG. 8H show schematic diagrams (e.g., schematic cross-sectional views) that illustrate elements and/or structures formed in a step in a method for manufacturing a semiconductor device in accordance with one or more embodiments.

Referring to FIG. 7 and FIG. 8A, the step S221 may include the following steps: preparing a substrate 11; and preparing a dielectric member 12, which may overlap the substrate 11. The substrate 11 may include two regions respectively designated for two p-channel device (e.g., a ULV PMOS device and an SVT PMOS device) and may include two regions respectively designated for two n-channel devices (e.g., a ULV NMOS device and an SVT NMOS device). The dielectric member 12 may have a trench 335, a trench 336, a trench 333, and a trench 334, which may be respectively designated for (a gate structure of) the ULV PMOS device, (a gate structure of) the ULV NMOS device, (a gate structure of) the SVT PMOS device, and (a gate structure of) the SVT NMOS device. The trenches 335, 336, 333, and 334 may respectively (partially) expose the two regions of the substrate 11.

Figure 8B:
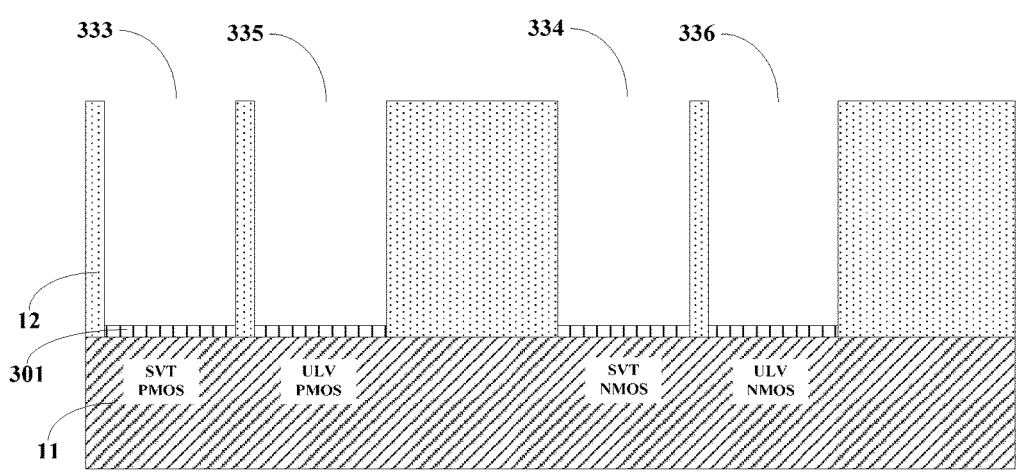

Referring to FIG. 7, FIG. 8A, and FIG. 8B, subsequent to the step S221, the step S222 may include providing an insulating layer 301 (or interface layer 301) in each of the trenches 335, 336, 333, and 334. The insulating layers 301 may directly contact exposed portions of the substrate 11.

Figure 8C:
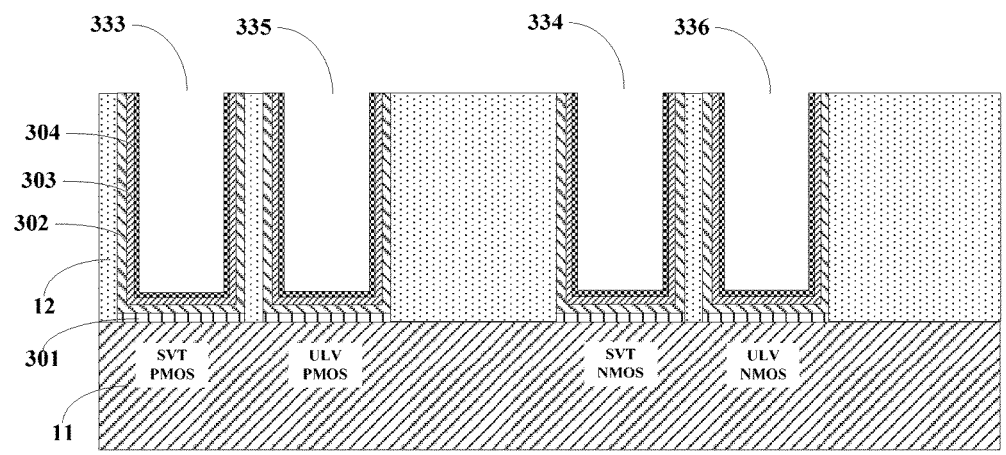

Referring to FIG. 7, FIG. 8B, and FIG. 8C, subsequent to the step S222, the step S223 may include sequentially providing a dielectric layer 302, a cap layer 303, and a barrier layer 304 inside each of the trench 331 and the trench 332. The dielectric layers 302 may be high-k dielectric layers with a dielectric constant greater than 3.9 and/or greater than a dielectric constant of silicon dioxide.

Referring to FIG. 7, FIG. 8C, FIG. 8D, and FIG. 8E, subsequent to the step S223, the step S224 may include removing (using a mask 305) the barrier layer 304 and the cap layer 303 that have been provided in the trench 336. The step S224 may include the following steps: providing the mask 305 (e.g., a patterned photoresist), which may cover the trenches 335, 333, and 334 and may expose the trench 336; performing (e.g., using ozone) one or more oxidation processes on the barrier layer 304 and the cap layer 303 that have been provided in the trench 336; performing (e.g., using $H_2O_2$ and $NH_3OH$; or $H_2O_2$ and HCl) one or more etching processes on the oxidized barrier layer 304 and cap layer 303 to remove the oxidized barrier layer 304 and cap layer 303, such that the dielectric layer 302 inside the trench 336 may be exposed; and removing the mask 305.

Figure 8D:
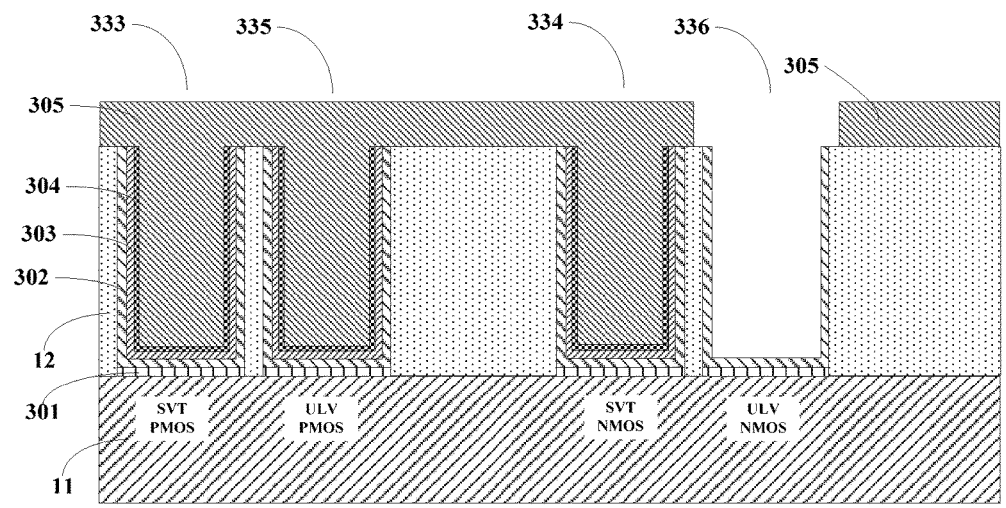
Figure 8E:
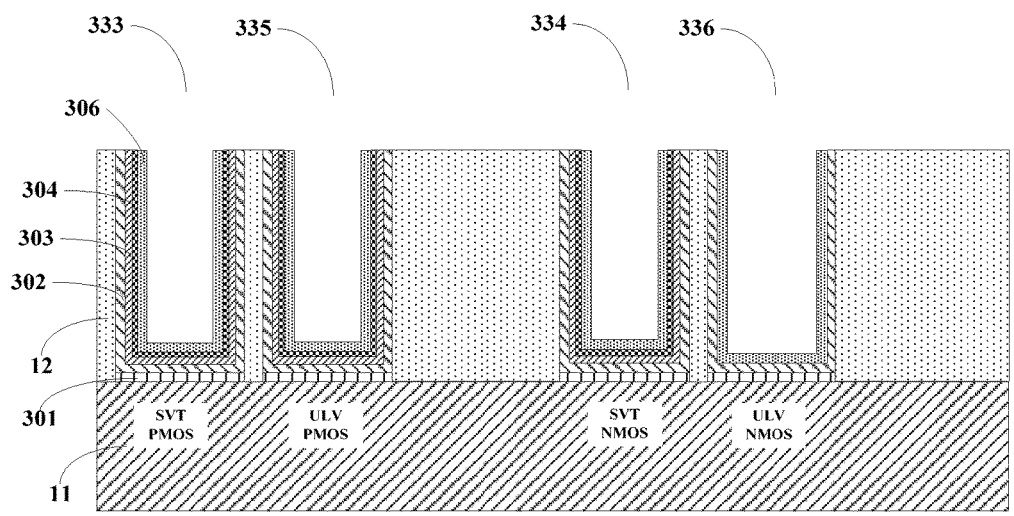

Referring to FIG. 7, FIG. 8D, and FIG. 8E, subsequent to the step S224, the step S225 may include providing a first-type work function layer 306 inside each of the trenches 335, 336, 333, and 334. The first-type work function layer 306 provided inside the trench 335 may directly contact the barrier layer 304 inside the trench 335. The first-type work function layer 306 provided inside the trench 336 may directly contact the dielectric layer 302 inside the trench 336. The first-type work function layer 306 provided inside the trench 333 may directly contact the barrier layer 304 inside the trench 333. The first-type work function layer 306 provided inside the trench 334 may directly contact the barrier layer 304 inside the trench 334.

Referring to FIG. 7, FIG. 8E, FIG. 8F, and FIG. 8G, subsequent to the step S225, the step S226 may include the following steps: removing, using a mask 307 such as a patterned photoresist, the first-type work function layers 306 that have been provided inside the trenches 336, 333, and 334; and removing the mask 307.

Figure 8F:
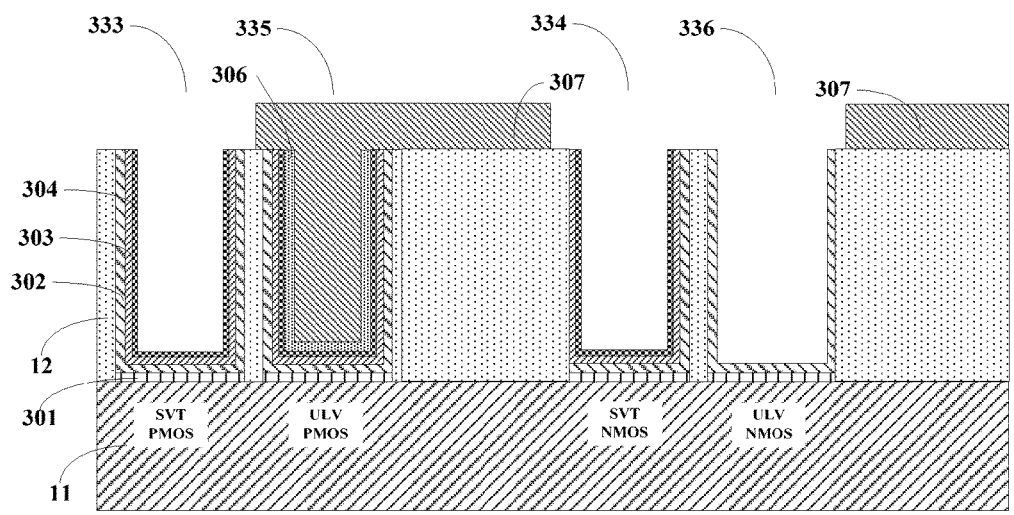
Figure 8G:
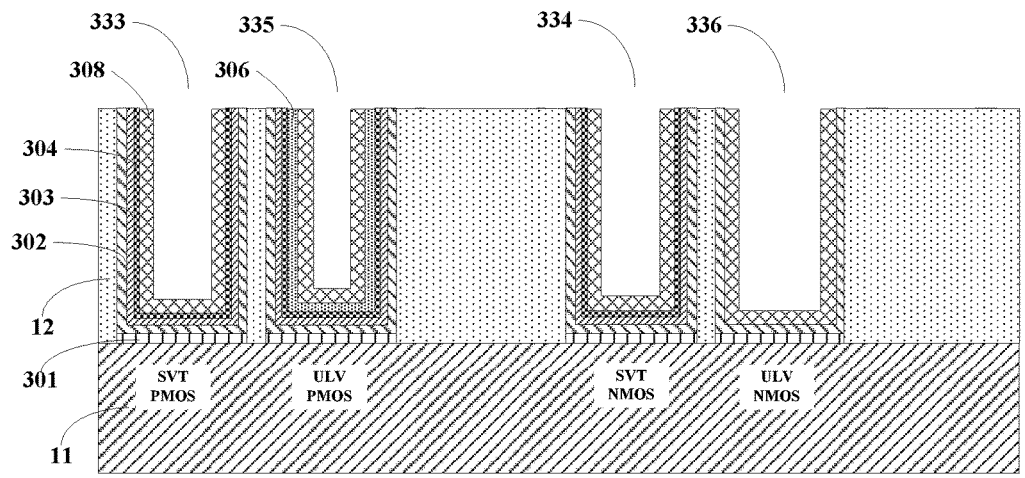

Referring to FIG. 7, FIG. 8F, and FIG. 8G, subsequent to the step S226, the step S227 may include providing a second-type work function layer 308 inside each of the trenches 335, 336, 333, and 334. The second-type work function layer 308 provided inside the trench 335 may directly contact the first-type work function layer 306 inside the trench 335. The second-type work function layer 308 provided inside the trench 336 may directly contact the dielectric layer 302 inside the trench 336. The second-type work function layer 308 provided inside the trench 333 may directly contact the barrier layer 304 inside the trench 333. The second-type work function layer 308 provided inside the trench 334 may directly contact the barrier layer 304 inside the trench 334.

Figure 8H:
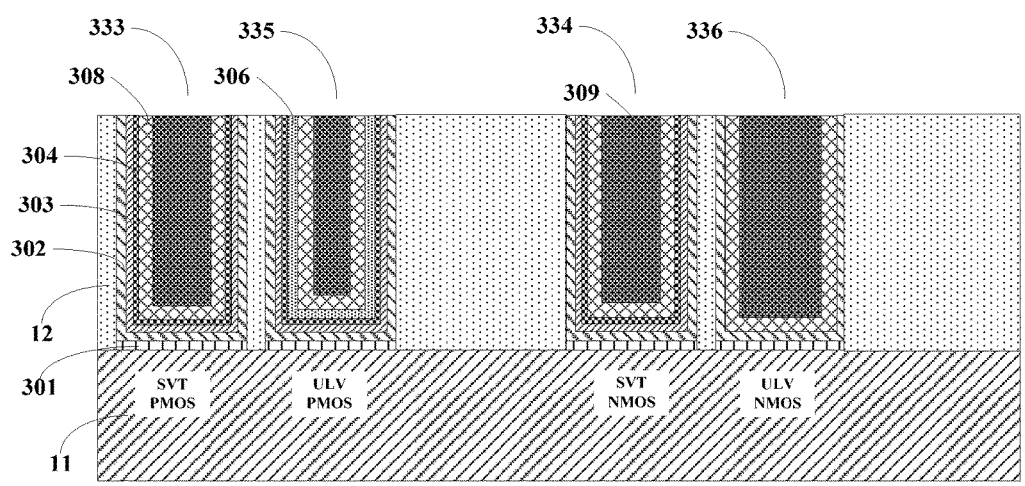

Referring to FIG. 7, FIG. 8G, and FIG. 8H, subsequent to the step S227, the step S228 may include providing a metal member (e.g., an electrode) inside each of the trenches 335, 336, 333, and 334. The metal member 309 provided inside the trench 335 may directly contact the second-type work function layer 308 inside the trench 335. The metal member 309 provided inside the trench 336 may directly contact the second-type work function layer 308 provided inside the trench 336. The metal member 309 provided inside the trench 333 may directly contact the second-type work function layer 308 inside the trench 333. The metal member 309 provided inside the trench 334 may directly contact the second-type work function layer 308 provided inside the trench 334.

As a result, in the semiconductor device, The ULV PMOS device may include the following elements inside the trench 335: a metal member 309, a dielectric layer 302 positioned between the substrate 11 and the metal member 309, a barrier layer 304 positioned between the dielectric layer 302 and the metal member 309, a first-type work function layer 306 directly contacting the barrier layer 304 and positioned between the barrier layer 304 and the metal member 309, and a second-type work function layer 308 directly contacting both the first-type work function layer 306 and the metal member 309 and positioned between the first-type work function layer 306 and the metal member 309.

The ULV NMOS device may include the following elements inside the trench 336: a metal member 309, a dielectric layer 302 positioned between the substrate 11 and the metal member 309, and a second-type work function layer 308 directly contacting both the dielectric layer 302 and the metal member 309 and positioned between the dielectric layer 302 and the metal member 309.

The SVT PMOS device may include the following elements inside the trench 333: a metal member 309, a dielectric layer 302 positioned between the substrate 11 and the metal member 309, a barrier layer 304 positioned between the dielectric layer 302 and the metal member 309, and a second-type work function layer 308 directly contacting both the barrier layer 304 and the metal member 309 and positioned between the barrier layer 304 and the metal member 309.

The SVT NMOS device may include the following elements inside the trench 334: a metal member 309, a dielectric layer 302 positioned between the substrate 11 and the metal member 309, a barrier layer 304 positioned between the dielectric layer 302 and the metal member 309, and a second-type work function layer 308 directly contacting both the barrier layer 304 and the metal member 309 and positioned between the barrier layer 304 and the metal member 309.

Based on the work function structures of the devices, a threshold voltage of the ULV PMOS device may be lower than a threshold voltage of the SVT PMOS device, and a threshold voltage of the ULV NMOS device may be lower than a threshold voltage of the SVT NMOS device.

According to embodiments, in manufacturing of a semiconductor device, the number of lithography processes and/or masks required for implementing different work function structures may be minimized. Advantageously, manufacturing cost and/or manufacturing time for the semiconductor may be minimized.

According to embodiments, in implementation of different work function structures of a semiconductor device, numbers of material layers may be minimized, such that sufficient spaces for filling metal material may be provided. Advantageously, implementation of metal gates in the semiconductor device may be facilitated, satisfactory quality of the metal gates may be attained, and/or satisfactory quality of the semiconductor device may be attained.

While some embodiments have been described as examples, there are alterations, permutations, and equivalents. It should be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is intended that the following appended claims be interpreted as including all alterations, permutations, and equivalents.

What is claimed is:

1. A semiconductor device comprising: a substrate; a first p-channel device, which comprises: a first metal member, a first dielectric layer formed of a first material and positioned between the substrate and the first metal member, a first barrier layer formed of a second material different from the first material and positioned between the first dielectric layer and the first metal member, a first first-type work function layer directly contacting the first barrier layer and positioned between the first barrier layer and the first metal member, and a first second-type work function layer directly contacting both the first first-type work function layer and the first metal member and positioned between the first first-type work function layer and the first metal member; and a first n-channel device, which comprises: a second metal member, a second dielectric layer formed of the first material and positioned between the substrate and the second metal member, and a second second-type work function layer directly contacting both the second dielectric layer and the second metal member and positioned between the second dielectric layer and the second metal member; and a second p-channel device, which comprises: a third metal member, a third dielectric layer positioned between the substrate and the third metal member, a third barrier layer positioned between the third dielectric layer and the third metal member, and a third second-type work function layer directly contacting both the third barrier layer and the third metal member and positioned between the third barrier layer and the third metal member; and a second n-channel device, which comprises: a fourth metal member, a fourth dielectric layer positioned between the substrate and the fourth metal member, a fourth barrier layer positioned between the fourth dielectric layer and the fourth metal member, and a fourth second-type work function layer directly contacting both the fourth barrier layer and the fourth metal member and positioned between the fourth barrier layer and the fourth metal member.

2. The semiconductor device of claim 1, wherein a threshold voltage of the first p-channel device is lower than a threshold voltage of the second p-channel device, and wherein a threshold voltage of the first n-channel device is lower than a threshold voltage of the second n-channel device.

3. The semiconductor device of claim 1 comprising: a third p-channel device, which comprises: a fifth metal member, a fifth dielectric layer positioned between the substrate and the fifth metal member, a fifth first-type work function layer directly contacting the fifth dielectric layer and positioned between the fifth dielectric layer and the fifth metal member, and a fifth second-type work function layer directly contacting both the fifth first-type work function layer and the fifth metal member and positioned between the fifth first-type work function layer and the fifth metal member; and a third n-channel device, which comprises: a sixth metal member, a sixth dielectric layer positioned between the substrate and the sixth metal member, a sixth barrier layer positioned between the sixth dielectric layer and the sixth metal member, a sixth first-type work function layer directly contacting the sixth barrier layer and positioned between the sixth barrier layer and the sixth metal member, and a sixth second-type work function layer directly contacting both the sixth first-type work function layer and the sixth metal member and positioned between the sixth first-type work function layer and the sixth metal member.

4. The semiconductor device of claim 3, wherein a threshold voltage of the third p-channel device is higher than a threshold voltage of the second p-channel device, and wherein a threshold voltage of the third n-channel device is higher than a threshold voltage of the second n-channel device.

5. The semiconductor device of claim 4, wherein a threshold voltage of the first p-channel device is lower than the threshold voltage of the second p-channel device, and wherein a threshold voltage of the first n-channel device is lower than the threshold voltage of the second n-channel device.

6. A method for manufacturing a semiconductor device, the method comprising: providing a substrate; providing a first p-channel device, which comprises: a first metal member, a first dielectric layer formed of a first material and positioned between the substrate and the first metal member, a first barrier layer formed of a second material different from the first material and positioned between the first dielectric layer and the first metal member, a first first-type work function layer directly contacting the first barrier layer and positioned between the first barrier layer and the first metal member, and a first second-type work function layer directly contacting both the first first-type work function layer and the first metal member and positioned between the first first-type work function layer and the first metal member; and providing a first n-channel device, which comprises: a second metal member, a second dielectric layer formed of the first material and positioned between the substrate and the second metal member, and a second second-type work function layer directly contacting both the second dielectric layer and the second metal member and positioned between the second dielectric layer and the second metal member; preparing a dielectric member, which overlaps the substrate, wherein the dielectric member has a first trench and a second trench, which are respectively designated for the first p-channel device and the first n-channel device; sequentially providing the first dielectric layer, the first barrier layer, and the first first-type work function layer inside the first trench; sequentially providing a second dielectric layer, and a second barrier layer inside the second trench; removing the second barrier layer; providing a second first-type work function layer, which directly contacts the second dielectric layer; and removing the second first-type work function layer.

7. The method of claim 6 comprising: providing the first second-type work function layer, which directly contacts the first first-type work function layer; providing the second second-type work function layer, which directly contacts the second dielectric layer; providing the first metal member, which directly contacts the first second-type work function layer; and providing the second metal member, which directly contacts the second second-type work function layer.

8. The method of claim 7, wherein the dielectric member has a third trench and a fourth trench, which are respectively designated for a second p-channel device and a second n-channel device, the method comprising:
sequentially providing a third dielectric layer, a third barrier layer, and a third first-type work function layer inside the third trench;
sequentially providing a fourth dielectric layer, a fourth barrier layer, and a fourth first-type work function layer inside the fourth trench; and
removing the third first-type work function layer and the fourth first-type work function layer.

9. The method of claim 8 comprising:
providing a third second-type work function layer, which directly contacts the third barrier layer;
providing a fourth second-type work function layer, which directly contacts the fourth barrier layer;
providing a third metal member, which directly contacts the third second-type work function layer; and
providing a fourth metal member, which directly contacts the fourth second-type work function layer.

10. The method of claim 9, wherein a threshold voltage of the first p-channel device is lower than a threshold voltage of the second p-channel device, and wherein a threshold voltage of the first n-channel device is lower than a threshold voltage of the second n-channel device.

11. The method of claim 9, wherein the dielectric member has a fifth trench and a sixth trench, which are respectively designated for a third p-channel device and a third n-channel device, the method comprising:
sequentially providing a fifth dielectric layer and a fifth barrier layer inside the fifth trench;
sequentially providing a sixth dielectric layer and a sixth barrier layer inside the sixth trench;
removing the fifth barrier layer;
after the fifth barrier layer have been removed, providing a fifth first-type work function layer, which directly contacts the fifth dielectric layer; and
providing a sixth first-type work function layer, which directly contacts the sixth barrier layer.

12. The method of claim 11 comprising:
providing a fifth second-type work function layer, which directly contacts the fifth first-type work function layer;
providing a sixth second-type work function layer, which directly contacts the sixth first-type work function layer;
providing a fifth metal member, which directly contacts the fifth second-type work function layer; and
providing a sixth metal member, which directly contacts the sixth second-type work function layer.

13. The method of claim 12, wherein a threshold voltage of the third p-channel device is higher than a threshold voltage of the second p-channel device, and wherein a threshold voltage of the third n-channel device is higher than a threshold voltage of the second n-channel device.

14. The method of claim 13, wherein a threshold voltage of the first p-channel device is lower than the threshold voltage of the second p-channel device, and wherein a threshold voltage of the first n-channel device is lower than the threshold voltage of the second n-channel device.

15. The method of claim 11 comprising: using a first mask for removing the second barrier layer, the second cap layer, the fifth barrier layer, and the fifth cap layer.

16. The method of claim 15 comprising: using a second mask for removing the second first-type work function layer, the third first-type work function layer, and the fourth first-type work function layer.

* * * * *